: US 8,040,018 B2
(45) Date of Patent: Oct. 18, 2011

(12) United States Patent
Kondo

(54) PIEZOELECTRIC TRANSFORMER TYPE HIGH-VOLTAGE POWER APPARATUS AND IMAGE FORMING APPARATUS

(75) Inventor: Takashi Kondo, Yokohama (JP)

(73) Assignee: Samsung Electronics Co., Ltd., Suwon-Si (KR)

( * ) Notice: Subject to any disclaimer, the term of this patent is extended or adjusted under 35 U.S.C. 154(b) by 388 days.

(21) Appl. No.: 12/169,210

(22) Filed: Jul. 8, 2008

(65) Prior Publication Data
US 2009/0045697 A1 Feb. 19, 2009

(30) Foreign Application Priority Data

Aug. 1, 2007 (JP) ................................. 2007-200793
Nov. 19, 2007 (KR) ....................... 10-2007-0118097

(51) Int. Cl.
*H02N 2/06* (2006.01)
(52) U.S. Cl. ......................... 310/318; 310/311; 310/317
(58) Field of Classification Search .................. 310/318, 310/317, 311
See application file for complete search history.

(56) References Cited

U.S. PATENT DOCUMENTS

| 5,436,622 | A | * | 7/1995 | Gutman et al. ................ 340/7.6 |
| 5,446,659 | A | * | 8/1995 | Yamawaki ....................... 701/29 |
| 5,894,184 | A | * | 4/1999 | Furuhashi et al. ....... 310/316.01 |
| 6,232,728 | B1 | * | 5/2001 | Yamamoto et al. ........... 315/307 |
| 7,196,475 | B2 | * | 3/2007 | Saito et al. ....................... 315/55 |
| 2004/0100592 | A1 | * | 5/2004 | Nakanishi et al. ................ 349/2 |
| 2006/0220495 | A1 | * | 10/2006 | Yamaguchi et al. .......... 310/318 |

* cited by examiner

*Primary Examiner* — Walter Benson
*Assistant Examiner* — Bryan P Gordon
(74) *Attorney, Agent, or Firm* — Staas & Halsey LLP

(57) ABSTRACT

A piezoelectric transformer high-voltage power source apparatus, in which a driving voltage determined by a value of a driving frequency is applied to a piezoelectric transformer, and thereby an output voltage output by the piezoelectric transformer is provided to a load, includes: an output voltage detection unit to compare an output voltage with a reference voltage for controlling the output voltage, in order to maintain the output voltage at a predetermined value, and based on the comparison result, detecting the change of the output voltage as a digital value; and a driving control unit to perform driving control of the piezoelectric transformer according to the detected digital value. The high-voltage power source apparatus performs stable frequency control without falling into an abnormal oscillation or uncontrollable state, and a high-voltage can be output within a short rise time.

18 Claims, 16 Drawing Sheets

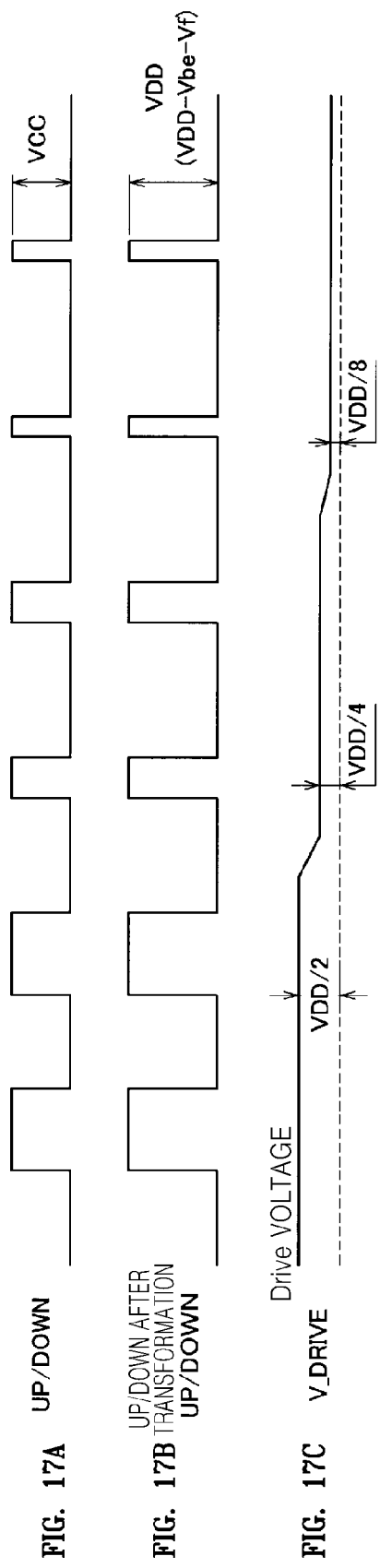

PIEZOELECTRIC TRANSFORMER TYPE HIGH-VOLTAGE POWER APPARATUS AND IMAGE FORMING APPARATUS

CROSS-REFERENCE TO RELATED APPLICATION

This application claims all benefits accruing under 35 U.S.C. §119 from Japanese Patent Application No. 2007-200793, filed on Aug. 1, 2007, in the Japanese Intellectual Property Office, and Korean Patent Application No. 2007-118097, filed on Nov. 19, 2007, in the Korean Intellectual Property Office, the disclosures of which are incorporated herein by reference.

BACKGROUND OF THE INVENTION

1. Field of the Invention

The present invention relates to a power source apparatus using a piezoelectric transformer, and an image forming apparatus thereof.

2. Description of the Related Art

In an image forming apparatus which forms an image in an electronic photographing process, if a direct transfer method is employed to enable a transfer unit to be in contact with a photoreceptor to transfer an image, the transfer unit uses a conductive rubber in the form of a roller having a rotation axis as a conductive body. In this case, driving of the transfer unit is controlled according to a process speed of the photoreceptor. Also, a direct current (DC) bias voltage is used as a voltage to be applied to the transfer unit, and a polarity of the DC bias voltage is made the same as that of a transfer voltage via a corona discharge method.

Thus, in order to perform reliable transfer of the image by using the transfer roller, a voltage of approximately 3 kV (with required current of microamperes) should be applied in general. According to a typical technique, in order to generate a high voltage required for image formation, a coil-type electronic transformer has been used. However, the coil-type electronic transformer is formed with copper wires, bobbins, and magnetic cores. When the coil-type electronic transformer is used to apply a voltage of approximately 3 kV, an output current value thereof is very low (i.e., microamperes), and a leakage current in each part should be minimized. In order to minimize the leakage current, a method of making the coil of the coil-type electronic transformer with a mould made of an organic insulating material has been used. However, when this method is used, there are risks of overheating to produce smoke and fire, and a relatively larger electronic transformer compared to a supplied power is required. Accordingly, it is difficult to reduce the size and weight of the coil-type electronic transformer.

In order to solve the above problems associated with the coil-type electronic transformer, a method of generating a high output voltage using a slim, light-weight, and high-output piezoelectric transformer has been considered. That is, if a piezoelectric transformer using a ceramic material is employed, it is possible to generate a high output voltage with an efficiency equal to or higher than that of the coil-type electronic transformer. Furthermore, since the piezoelectric transformer is irrespective of combining of a primary side thereof and a secondary side, putting a distance between electrodes of the primary side and the secondary side is possible, mould processing is not necessary, and risks of producing smoke and fire disappear. As a result, a method of generating a high output voltage by using the piezoelectric transformer enables a small-size and light-weight high-voltage power source apparatus to be made.

However, in the high-voltage power source apparatus using a piezoelectric transformer, frequency control is performed by an analogue signal processing circuit, and therefore, a frequency control operation is unstable. That is, if a control voltage is rapidly changed in order to quickly raise (or drop) an output voltage of the high-voltage power source apparatus, a resonant frequency of the piezoelectric transformer is exceeded and it is impossible to control the output voltage. Also, when power equal to or greater than a capacity of a piezoelectric transformer is required due to an unpredicted situation, a driving frequency of the piezoelectric transformer exceeds the resonant frequency, and it is impossible to control the output voltage of the piezoelectric transformer, to thereby cause bad image signals to be generated. Also, even as the output voltage from the piezoelectric transformer cannot be controlled, oscillation of a circuit operation in the high-voltage power source apparatus occurs.

In addition, a delay of a rise time occurs due to a spurious driving frequency from a time when a control signal to turn on the high-voltage power source apparatus is input to an operational amplifier to a time when a desired set output voltage value is reached.

Furthermore, as a plurality of resonant frequency points relative to the output voltages exists for a piezoelectric transformer, in order to increase a range of the output voltages that may be output by the piezoelectric transformer, frequencies in a range that result in low efficiency voltage output would be used, which decreases the overall efficiency of the high-voltage power source apparatus as a whole.

In addition, the driving frequency of the piezoelectric transformer is changed too much from a primary resonant frequency in order to reduce the output voltage, the driving frequency approaches a next resonant frequency, and as a result, the output voltage will start to increase after reaching a minimum voltage. For this reason, it is difficult to achieve a low voltage output of the high-voltage power source apparatus using the piezoelectric transformer.

SUMMARY OF THE INVENTION

Several aspects and example embodiments of the present invention provide a high-voltage power source apparatus provided with a piezoelectric transformer and an image forming apparatus in which a stable driving frequency control can be realized without falling into an abnormal oscillation or uncontrollable state, and a stable high-voltage can be output within a short rise time.

Additional aspects and/or advantages of the invention will be set forth in part in the description which follows and, in part, will be obvious from the description, or may be learned by practice of the invention.

In accordance with an example embodiment of the present invention, there is provided a power source apparatus in which a driving voltage controlled by a predetermined driving frequency is applied to a piezoelectric transformer to output an output voltage, the apparatus including: an output voltage detection unit to compare the output voltage with a reference voltage for controlling the output voltage with a predetermined value, and based on a comparison result thereof, detecting a change of the output voltage representing the change with a digital value; and a driving control unit to perform driving control of the piezoelectric transformer according to the detected digital value.

According to another aspect of the present invention, there is provided a power source apparatus in which a driving voltage controlled by a predetermined driving frequency is applied to a piezoelectric transformer to output an output voltage, the apparatus including: a driving control unit to calculate a change amount of the output voltage based on the output voltage and a reference voltage for controlling the output voltage to a predetermined value, and to control the driving frequency of the piezoelectric transformer by a digital signal processing technique based on the calculated change amount.

According to another aspect of the present invention, there is provided a power source apparatus in which a driving voltage controlled by a predetermined driving frequency is applied to a piezoelectric transformer to output an output voltage, the apparatus including: an output voltage detection unit to compare the output voltage with a reference voltage for controlling the output voltage with a predetermined value, and based on a comparison result thereof, detecting a change of the output voltage representing the change with a digital value; a driving control unit to perform driving control of the piezoelectric transformer according to the detected digital value; and a drive voltage control unit to vary and control a power source voltage applied to the piezoelectric transformer according to the comparison result of the output voltage with the reference voltage.

According to another aspect of the present invention, there is provided an image forming apparatus including: a charging unit to identically charge a surface of a latent image supporter; an exposure unit to form a latent image on the surface of the latent image supporter after the charging thereof; a developing unit to develop the latent image; a transfer unit to transfer a toner image formed on the latent image supporter to a transfer material; and a power source apparatus to provide a voltage to at least one of the charging unit, the exposure unit, the developing unit, and the transfer unit, wherein the power source apparatus is a power source apparatuses containing a piezoelectric transformer.

The power source apparatus according to the present invention includes: an output voltage detection unit to compare an output voltage with a reference voltage for controlling the output voltage with a predetermined value, and based on the comparison result, detecting a change of the output voltage representing the change with a digital value; and a driving control unit to perform driving control of the piezoelectric transformer according to the detected digital value. Accordingly, stable frequency control can be performed without falling into an abnormal oscillation or uncontrollable state, and a high-voltage can be output within a short rise time.

According to an example embodiment of the present invention, a method of generating a driving voltage to drive a piezoelectric transformer of a high-voltage power source apparatus based on an output voltage of the piezoelectric transformer, includes: comparing the output voltage with a reference voltage to generate a digital count up/down signal; using the digital count up/down signal to either increase or decrease a counter value representing a driving frequency of the piezoelectric transformer; and making a comparison between the counter value and predetermined frequency values representing a predetermined driving frequency range of the piezoelectric transformer, and generating the driving voltage to drive the piezoelectric transformer in a predetermined voltage range based on the counter value and the comparison.

According to an example embodiment of the present invention, a piezoelectric transformer high-voltage power source apparatus to generate a driving voltage to drive the piezoelectric transformer based on an output voltage of the piezoelectric transformer, includes: a first comparator to compare the output voltage with a reference voltage to generate a digital count up/down signal; a counter to use the digital count up/down signal to either increase or decrease a counter value representing a driving frequency of the piezoelectric transformer; and a second comparator to make a comparison between the counter value and predetermined frequency values representing a predetermined driving frequency range of the piezoelectric transformer; and a voltage generator to generate the driving voltage to drive the piezoelectric transformer in a predetermined voltage range based on the counter value and the comparison.

In addition to the example embodiments and aspects as described above, further aspects and embodiments will be apparent by reference to the drawings and by study of the following descriptions.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

FIGS. 17A-17C illustrate a diagram of a relationship between an UP/DOWN signal and a V_DRIVE signal in a piezoelectric transformer type high-voltage power source apparatus according to an example embodiment of the present invention.

DETAILED DESCRIPTION OF THE EMBODIMENTS

Figure 1:
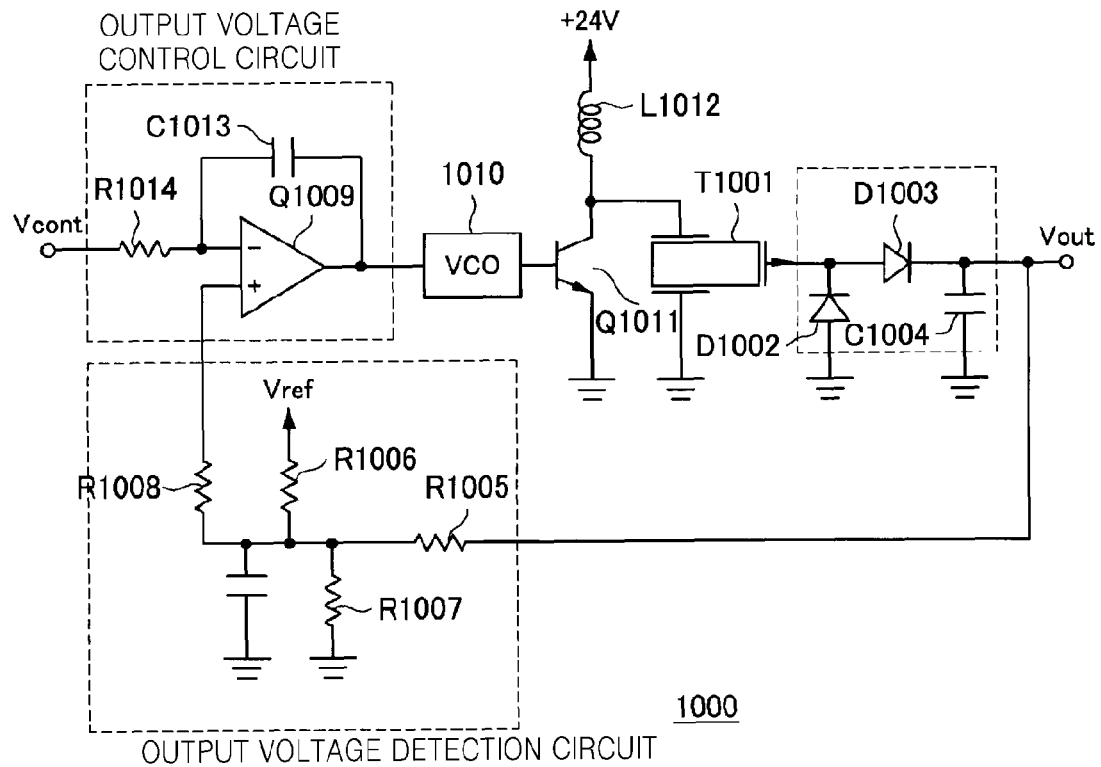
FIG. 1 is a block diagram of a typical piezoelectric transformer type high-voltage power source apparatus.

Reference will now be made in detail example embodiments of the present invention, examples of which are illustrated in the accompanying drawings, wherein like reference numerals refer to the like elements throughout. The example embodiments are described below in order to explain the present invention by referring to the figures.

Before explaining a piezoelectric transformer type high-voltage power source apparatus according to example embodiments of the present invention, a typical high-voltage power source apparatus will be explained with reference to FIGS. 1 through 3 in order to clarify differences in the structures between the piezoelectric transformer type high-voltage power source apparatus according to example embodiments of the present invention and the typical piezoelectric transformer type high-voltage power source apparatus.

FIG. 1 is a block diagram of a typical high-voltage power source apparatus. In the typical high-voltage power source apparatus, a piezoelectric ceramic transformer is used as a piezoelectric transformer T1001 to provide power. An alternating current (AC) output of the piezoelectric transformer T1001 is rectified and smoothed by diodes D1002, D1003 and a high-voltage capacitor C1004 to form a constant output voltage. The rectified and smoothed constant output voltage is provided to a transfer roller (not shown) of an image forming apparatus (not shown). Also, the rectified and smoothed constant output voltage is divided by resistors R1005, R1006, and R1007, and is input to a non-inverted input terminal (+ terminal) of an operational amplifier Q1009 through a protection resistor R1008.

Meanwhile, a control signal (Vcont) of a high-voltage power source, which is an analog signal, is input from a direct current (DC) controller (not shown) through a resistor R1014 to an inverted input terminal (− terminal) of the operational amplifier Q1009. The operational amplifier Q1009, the resistor R1014, and a capacitor C1013 form an integrator circuit, and the control signal (Vcont) that is integration-processed with an integration constant determined by values of the resistor R1014 and the capacitor C1013 is output from the operational amplifier Q1009.

The output end of the operational amplifier Q1009 is connected to a voltage-controlled oscillator (VCO) 1010, which drives a transistor Q1011 connected to an inductor L1012, to thereby provide power of a particular driving frequency to a primary side of the piezoelectric transformer T1001. In this way, a typical piezoelectric transformer T1001 is provided to generate power for use in an image forming apparatus.

Figure 2:
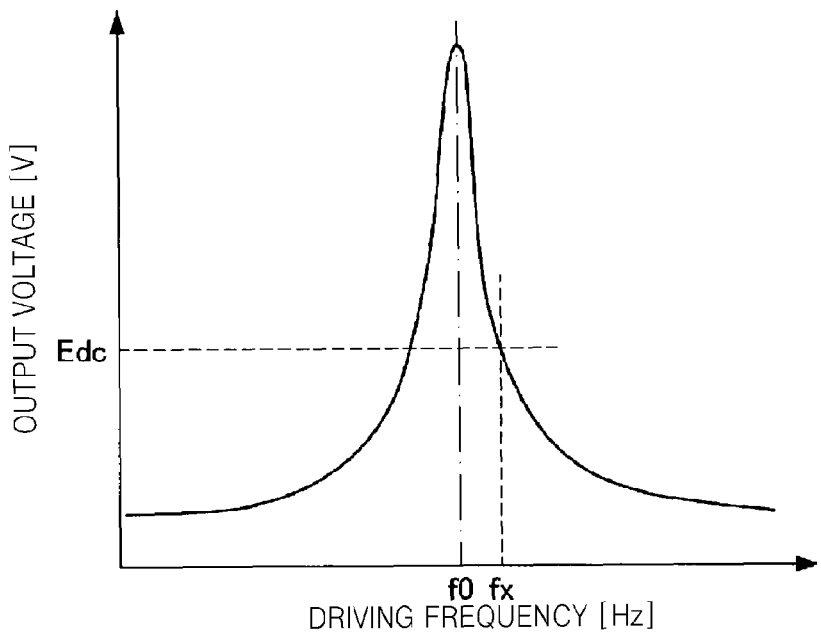
FIG. 2 is a diagram illustrating a first waveform of a driving frequency of a piezoelectric transformer in a typical piezoelectric transformer type high-voltage power source apparatus.
Figure 3:
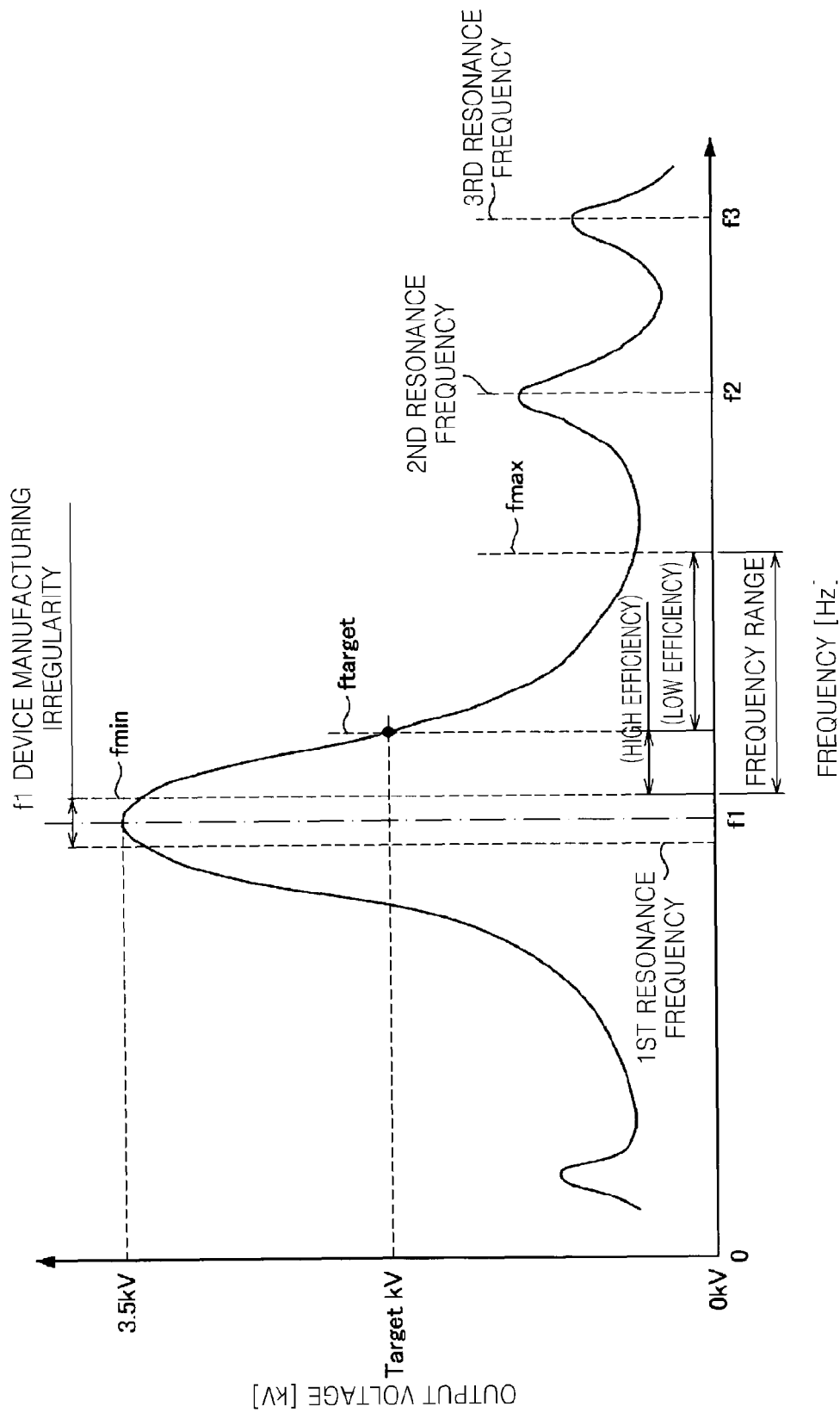
FIG. 3 is a diagram illustrating a second waveform of a driving frequency of a piezoelectric transformer in a typical piezoelectric transformer type high-voltage power source apparatus.

FIGS. 2 and 3 are waveform diagrams of a driving frequency of a piezoelectric ceramic transformer in a typical high-voltage power source apparatus. Shown in FIG. 2 is a general characteristic of a typical piezoelectric transformer, where a maximum output voltage occurs at a resonant frequency f0, and the output voltage decreases at a higher frequency side and a lower frequency side of the resonant frequency f0. Accordingly, by controlling the driving frequency of the typical piezoelectric transformer, the output voltage of the typical piezoelectric transformer can be controlled. By changing the driving frequency fx to be higher than the resonant frequency f0, the output voltage of the piezoelectric transformer can be changed.

A high-voltage power source apparatus of an image forming apparatus has a plurality of high-voltage power source circuits of a same type as that illustrated in FIG. 2, and forms images with biasing voltage outputs for charging, developing, and transferring processes. However, since the typical high-voltage power source apparatus controls the driving frequency of the piezoelectric transformer by processing an analog signal, as illustrated in FIG. 2, a time delay occurs before a desired output control voltage value is reached.

Also, a plurality of resonant points can exist in a piezoelectric transformer. For example, as illustrated in FIG. 3, four (4) resonant points may exist in a piezoelectric transformer relative to the driving frequencies. As illustrated in FIG. 3, a first resonant point exists in which an output voltage of about 3.5 kV can be obtained if a driving voltage with a corresponding first resonant frequency f1 is applied. At a higher frequency side of the first resonant frequency f1, a second resonant point (corresponding to a second resonant frequency f2) and a third resonant point (corresponding to a third resonant frequency f3), being local output voltage maximums, exist. Since each of the resonant points is a point at which an output voltage of the piezoelectric transformer becomes a maximum as illustrated in FIG. 3, if the frequency of a driving voltage of the piezoelectric transformer is changed to a frequency that is either higher or lower than a resonant frequency, the output voltage goes down as the frequency is changed.

However, even when the frequency is changed from the resonant frequency, if the maximum value of an output voltage is set to be in the kilovolts range, the frequency of the output voltage does not fall to hundreds of volts or less. This is due to a fact that even if the frequency is changed greatly, the frequency does not converge on 0 volts, but rather, approaches a next resonant frequency. Therefore, as the frequency is changed, after a certain minimum voltage is reached, the output voltage again increases until the next local maximum having a resonant frequency is reached.

In the frequency range corresponding to a driving voltage, a range of frequencies exists within which an output voltage of the piezoelectric transformer T201 may be most efficiently obtained, such as a range in the vicinity of a first resonant frequency f1. However, in order to increase a voltage range of the output voltage, frequencies in a voltage range within low output voltages, which give poor efficiency results (low efficiency in FIG. 3), with regards to generating a given output voltage, must also be used, and thus, the efficiency of the high-voltage power source apparatus as a whole is lowered.

In order to solve problems of the typical high-voltage power source apparatus as described in connection with FIG. 1, a piezoelectric transformer type high-voltage power source apparatus according an example embodiment of the present invention is designed to control a driving frequency of a piezoelectric transformer using digital signal processing techniques, and stabilize operations of the piezoelectric transformer, in order to realize a high-voltage output within a short rise time. The piezoelectric transformer type high-voltage power source apparatus according to an example embodiment of the present invention will now be explained with reference to FIGS. 4 through 8 herein below.

Figure 4:
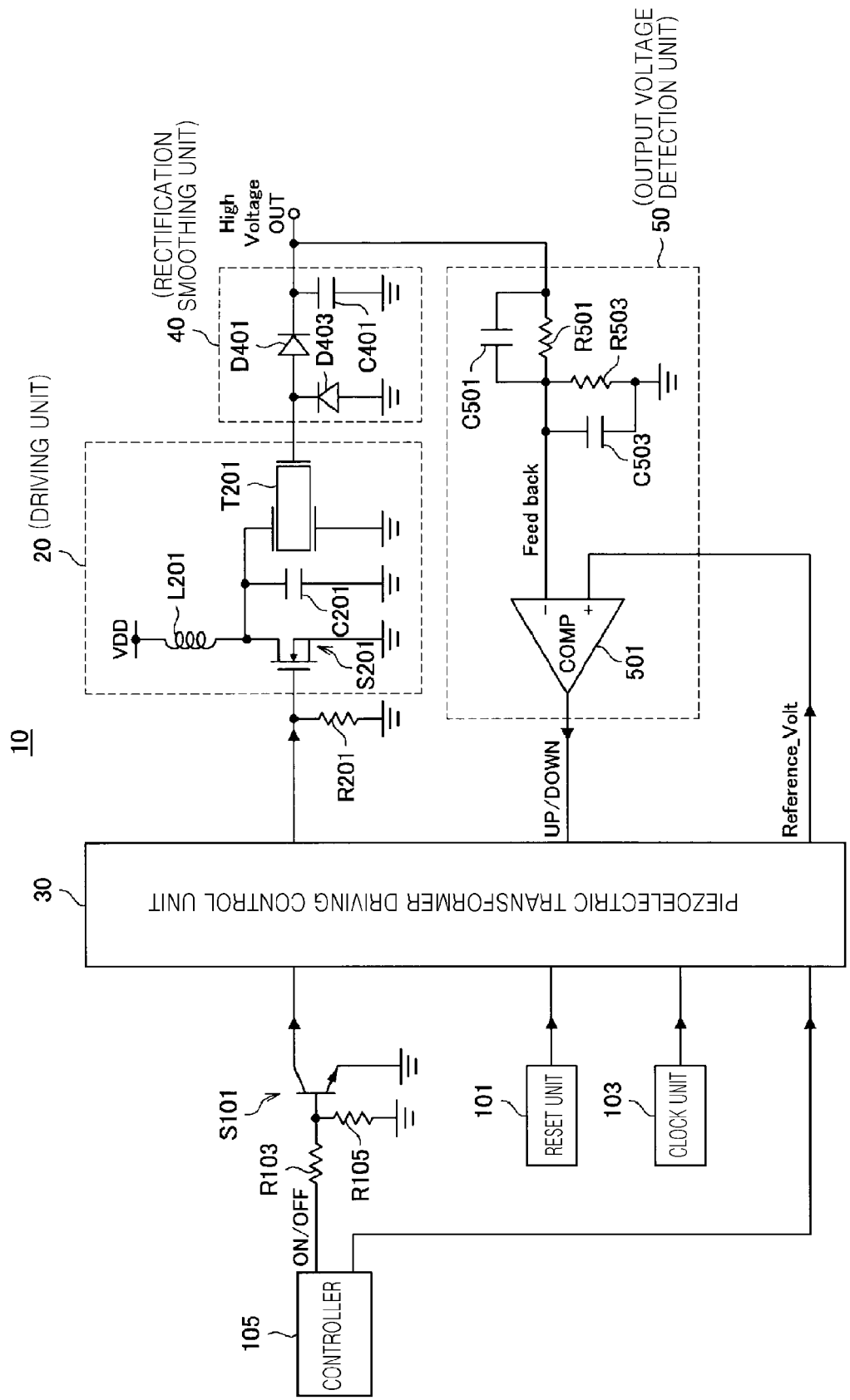
FIG. 4 is a block diagram of a piezoelectric transformer type high-voltage power source apparatus according to an example embodiment of the present invention.

FIG. 4 is a block diagram of a piezoelectric transformer type high-voltage power source apparatus 10 according to an example embodiment of the present invention. As shown in FIG. 4, the high-voltage power source apparatus 10 includes a driving unit 20, a piezoelectric transformer driving control unit 30, a rectification smoothing unit 40, and an output voltage detection unit 50.

The driving unit 20 includes a piezoelectric transformer T201, an inductor L201, a resistor R201, and a MOSFET switching device S201. If a power source $V_{DD}$ is connected to the inductor L201, a driving voltage that is frequency-controlled by a piezoelectric transformer driving control unit 30, which will be explained later, is input to the MOSFET switching device S201. The input driving voltage controls on/off states of the switching device S201, thereby raising an applied power source voltage or converting the applied power source voltage to a pseudo sine wave. Then, the converted power source voltage is applied to the piezoelectric transformer T201.

The piezoelectric transformer T201 of the driving unit 20 has a piezoelectric vibrating body having a primary electrode disposed at a primary side, and a secondary electrode disposed at a secondary side. At a primary side, the piezoelectric transformer T201 is polarized in a width direction and the polarized ends face each other with the piezoelectric vibrating body disposed between the polarized ends. At a secondary side, the piezoelectric transformer T201 is polarized in a length direction. The piezoelectric transformer T201 is accommodated in a resin case (not shown). The piezoelectric vibrating body is made of a piezoelectric ceramic, such as, plumbum (lead)-zirconate-titanate (PZT), and has a plate shape. In the length direction of the piezoelectric vibrating body, the primary electrode is disposed from one end to the middle of the piezoelectric vibrating body, for example, and the secondary electrode is disposed at the other end. If a driving voltage having a proper resonant frequency, which is determined by a length measure of the piezoelectric vibrating body, is applied to the primary side, a strong mechanical resonance is induced due to an inverse piezoelectric effect, and a high output voltage corresponding to a vibration thereof is output due to a piezoelectric effect.

The piezoelectric transformer driving control unit 30 controls a frequency (a driving frequency) of the driving voltage to control the piezoelectric transformer T201 of the driving unit 20. The piezoelectric transformer type high-voltage power source apparatus 10, as shown in FIG. 4, is characterized by the fact that the driving frequency of the piezoelectric transformer T201 is controlled by a digital signal processing technique performed by the piezoelectric transformer driving control unit 30. This piezoelectric transformer driving control unit 30 will be explained later in more detail.

The rectification smoothing unit 40 includes a capacitor C401 and diodes D401 and D403. An AC output of the piezoelectric transformer T201 is rectified and smoothed to a constant voltage (DC voltage) by the diodes D401 and D403 and the capacitor C401, and provided as an output voltage to a load, which may be a transfer roller (not shown) of an image forming apparatus (not shown).

The output voltage detection unit 50 includes capacitors C501 and C503, voltage divider resistors R501 and R503, and a comparator (COMP) 501. The output voltage, which is rectified and smoothed to a DC voltage by the rectification smoothing unit 40, is divided by the voltage divider resistors R501 and R503 in the output voltage detection unit 50 and is input to an inverted input terminal (− terminal) of the comparator 501 as an error detection voltage (Feedback). In this case, the capacitors C501 and C503 that are connected in parallel to the voltage divider resistors R501 and R503, respectively, adjust the AC and DC components of the output voltage. Also, an output control voltage, which is a DC voltage used to control the output voltage from an output terminal of the piezoelectric transformer driving control unit 30 is input as a reference voltage (Reference_Volt) to a non-inverted input terminal (+ terminal) of the comparator 501.

The comparator 501 compares magnitudes of the output control voltage (Reference_Volt) and the error detection voltage (Feedback) corresponding to the output voltage, and outputs a comparison result. If the output voltage (Feedback) (or the error detection voltage) is greater than the output control voltage (Reference_Volt), an output of the comparator 501 is at a "low" logic level, and if the output voltage (Feedback) (or the error detection voltage) is less than the output control voltage (Reference_Volt), the output of the comparator 501 is at a "high" logic level. Due to the comparator 501, an analog change in the output voltage (as represented by the error detection voltage (Feedback)) from an output terminal of the driving unit 20 can be represented by a digital value. The digital value output from the comparator 501 is a control signal (UP/DOWN) used to control a frequency control unit (shown in FIG. 9) in the piezoelectric transformer driving control unit 30, and is input to the piezoelectric transformer driving control unit 30.

Also, the piezoelectric transformer type high-voltage power source apparatus 10 further includes a reset unit 101 to provide a reset signal, a clock unit 103 to provide a clock signal, and a controller 105 to provide a driving control signal to the piezoelectric transformer T201. The driving control signal (ON/OFF signal) provided from the controller 105 is inverted by the resistors R101 (not shown), R103, and R105 and the switching device S101, and is converted as an open collector output to be input to the piezoelectric transformer driving control unit 30.

Figure 5:
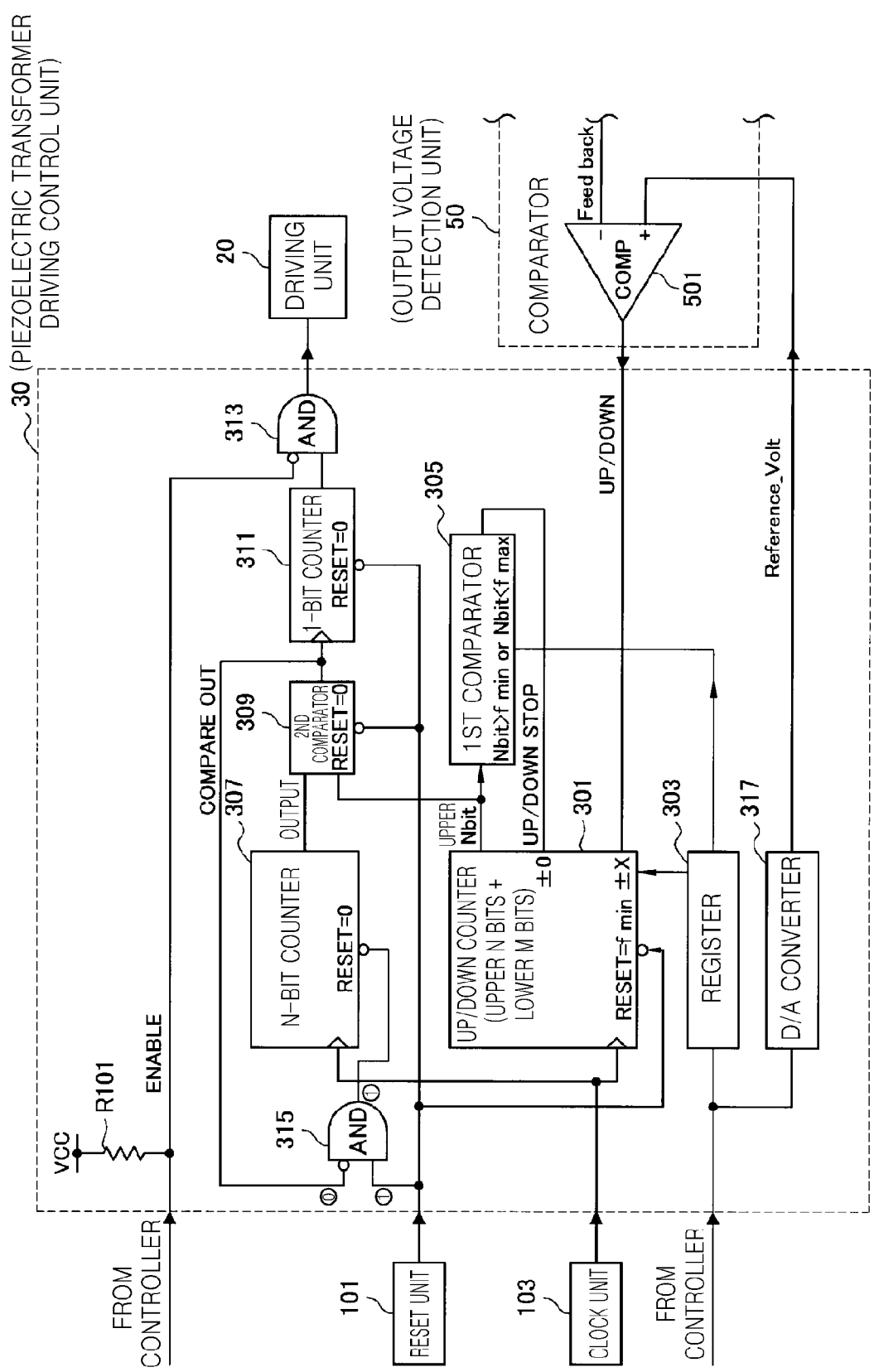
FIG. 5 is a block diagram of a piezoelectric transformer driving unit of a piezoelectric transformer typehigh-voltage power source apparatus according to an example embodiment of the present invention.

FIG. 5 is a detailed block diagram of a piezoelectric transformer driving control unit 30 shown in FIG. 4, according to an example embodiment of the present invention. The piezoelectric transformer driving control unit 30 includes a driving frequency control unit (discussed later) to vary and control the frequency of a driving voltage to drive the piezoelectric transformer T201, and a driving voltage generation unit (discussed later) to generate the driving voltage.

Referring to FIG. 5, the piezoelectric transformer driving control unit 30 includes the driving frequency control unit, which in turn includes an up/down counter 301, a register 303, and a first comparator 305. A high-speed clock signal, which is generated according to a required frequency control precision degree, is provided from the clock unit 103 to the up/down counter 301. Whenever the clock signal is at a "high" logic level, and if the control signal (UP/DOWN) from the output voltage detection unit 50 is at a "high" logic level, a counter value of the up/down counter 301 is increased by X. On the other hand, whenever the clock signal is at the "high" logic level, and if the control signal (UP/DOWN) is at a "low" logic level, the counter value of the up/down counter 301 is decreased by X. Also, a number of bits of a frequency control counter may have a format of {a number of bits of a driving voltage generation counter (N)+low order M bits, (N+M)} by setting the low order M bits values, thereby correcting a gain of an error feedback voltage (or error detection voltage) and enabling stable control of the piezoelectric transformer T201. Even when magnitudes of the output voltage (Feedback) and the output control voltage (Reference_Volt) are similar to each other and a change in the counter value of the up/down counter 301 becomes very small, if the number of bits of the frequency control counter is formed to be (N+M), the high order N bits do not change even when the low order M bits change. Accordingly, counting by the up/down counter 301 can be performed stably.

Here, a counter up/down value X is a register value that can also be freely set in order to correct a gain of the error feedback voltage, and can also be set by an external controller (not shown), or be a fixed value. The set value of the counter up/down value X is stored in the register 303 and referred to by the up/down counter 301 whenever necessary.

Figure 6:
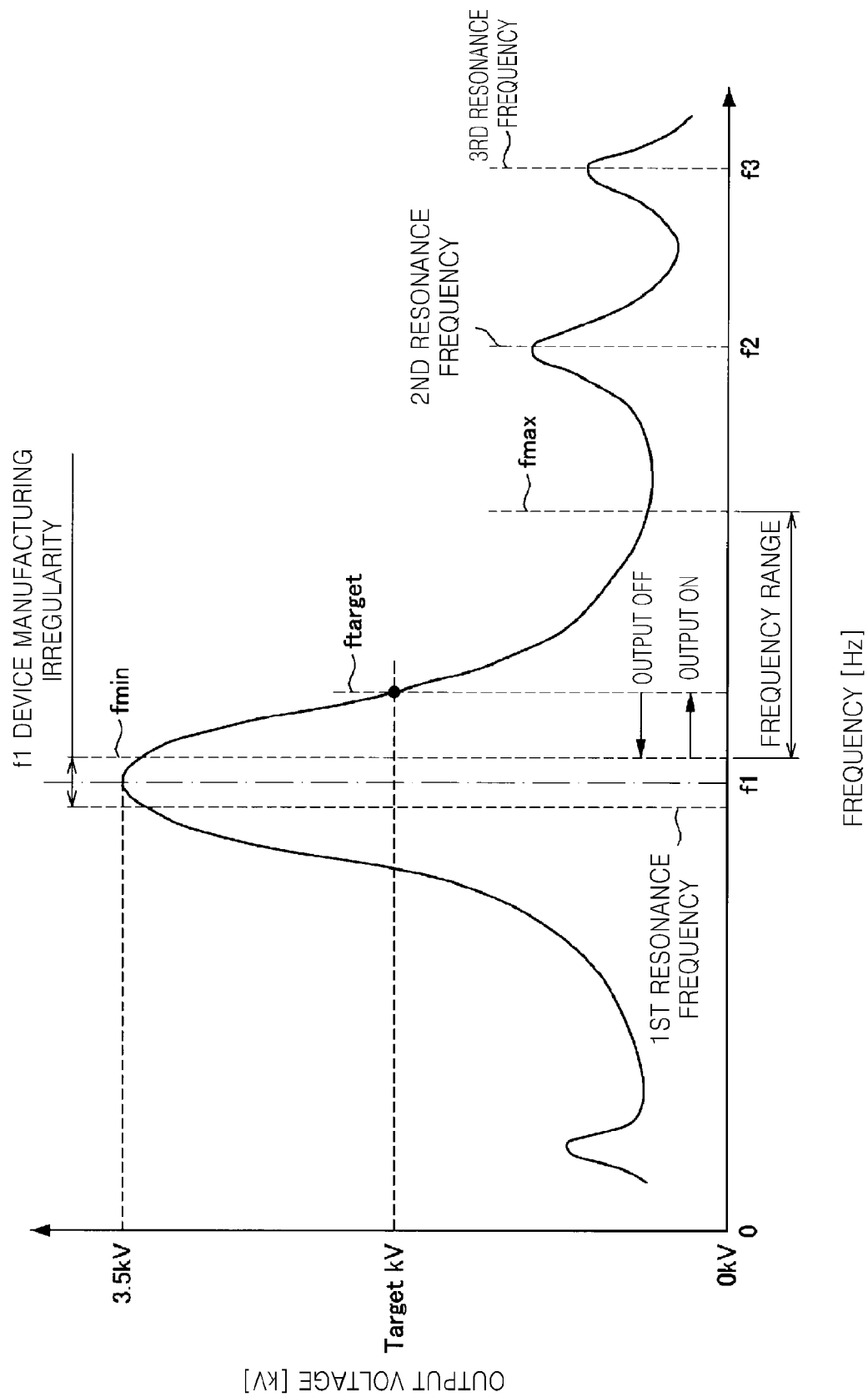
FIG. 6 is a waveform diagram of a driving frequency of a piezoelectric transformer type high-voltage power source apparatus according to an example embodiment of the present invention.
Figure 7:
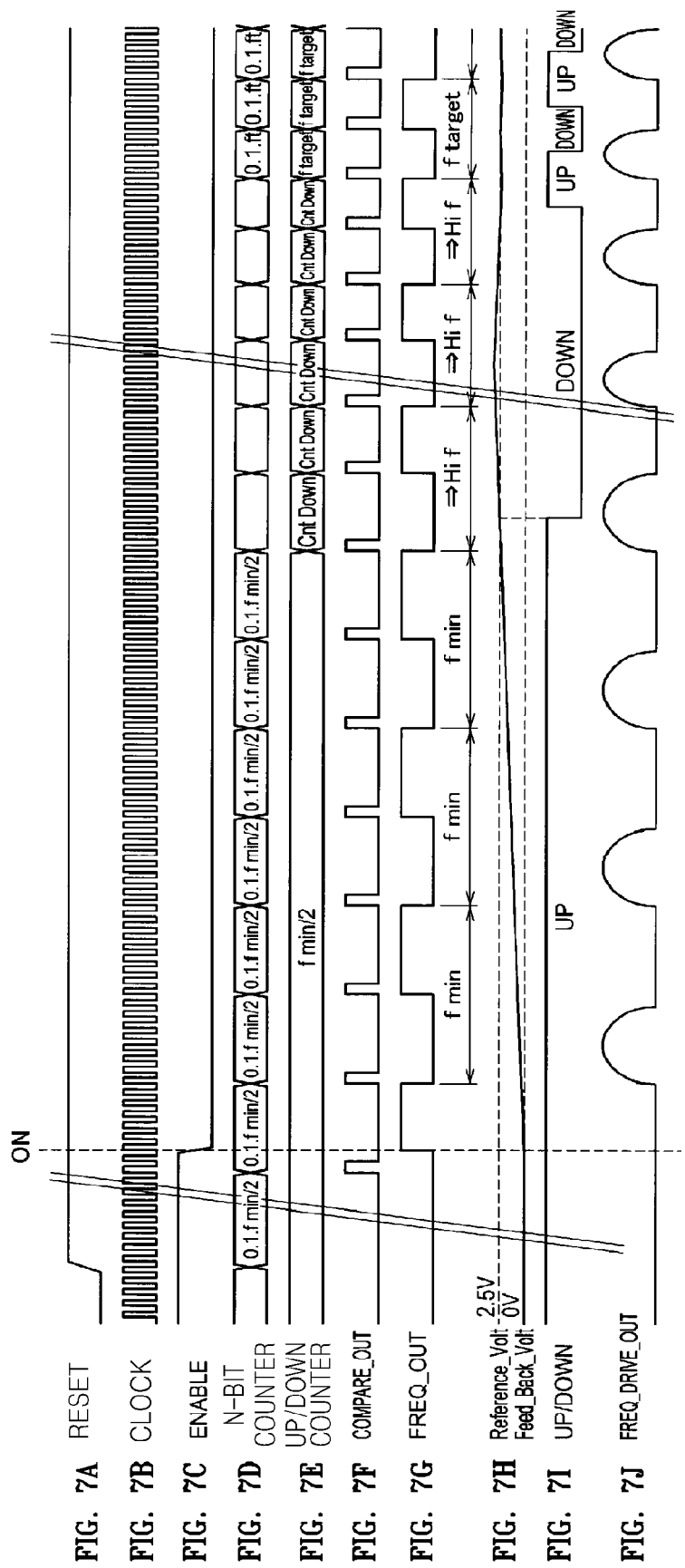
FIGS. 7A-7J illustrate first timing diagrams of a piezoelectric transformer type high-voltage power source apparatus according to an example embodiment of the present invention.
Figure 8:
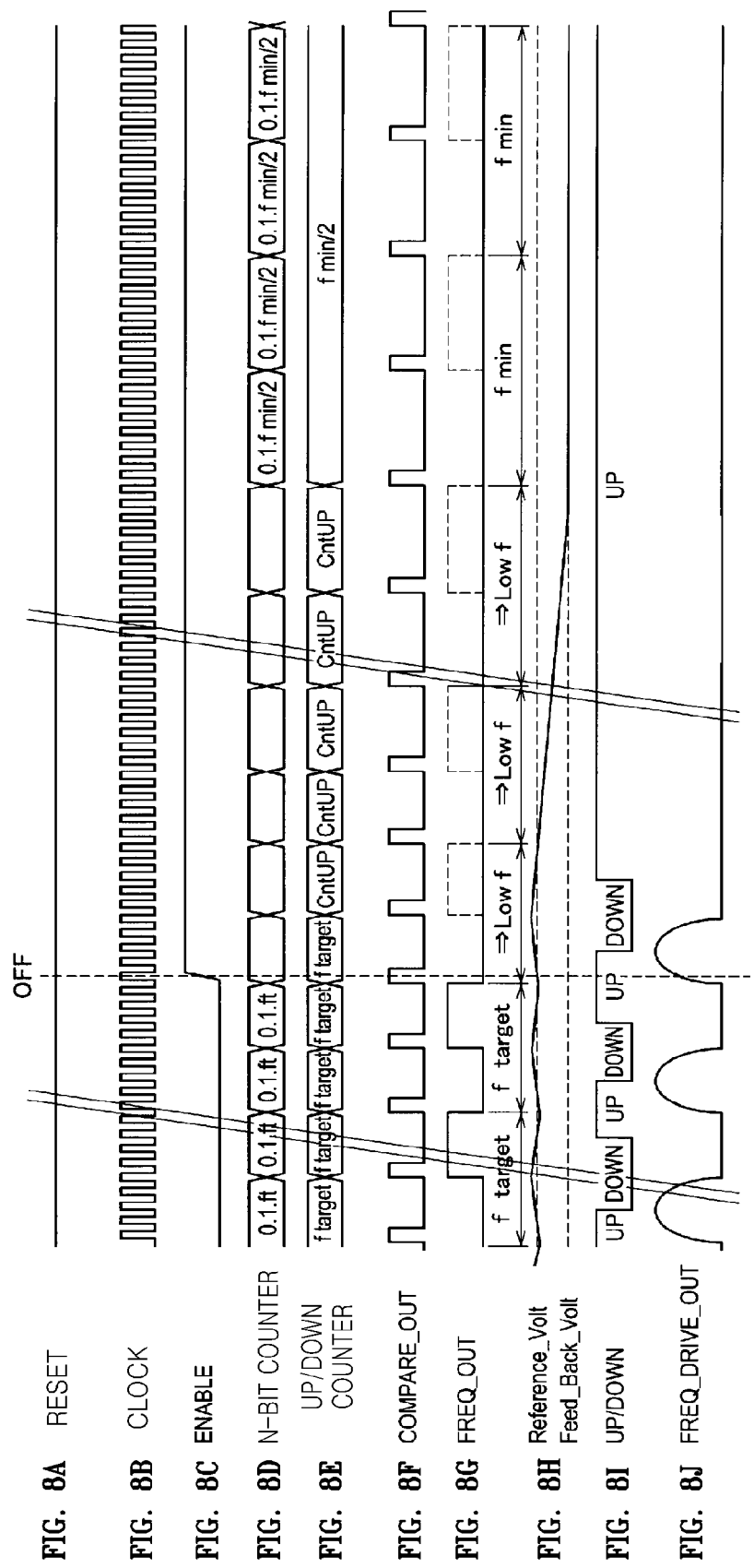
FIGS. 8A-8J illustrate second timing diagrams of a piezoelectric transformer type high-voltage power source apparatus according to an example embodiment of the present invention.

FIG. 6 is a waveform diagram of a driving frequency of a piezoelectric transformer type high-voltage power source apparatus shown in FIG. 4. Here, the output voltage varies with respect to the frequency of the driving voltage applied to the piezoelectric transformer T201. The output voltage of the piezoelectric transformer T201 has 3 extreme values (resonant points) as illustrated in FIG. 6. In the vicinity of a first resonant frequency f1 at a low frequency side of the waveform diagram, the highest output voltage is given. As the frequency increases toward a second resonant frequency f2 and a third resonant frequency f3 at the high frequency side of the waveform diagram, the value of the output voltage decreases. Accordingly, in order to most efficiently obtain an output voltage of the piezoelectric transformer T201, a driving frequency in the vicinity of the first resonant frequency f1 may be used.

Therefore, the counter value of the up/down counter 301 which is used for controlling the driving voltage frequency of the piezoelectric transformer T201 would converge on the frequency range that lies between fmin and fmax illustrated in FIG. 6. The frequency range can be obtained by taking an fmin value as a minimum frequency and a fmax value as a maximum frequency. The fmin value is a frequency value reflecting a manufacturing irregularity of the piezoelectric transformer in the first resonant frequency f1, and the fmax value is the frequency value immediately before the output voltage curve goes up between the first resonant frequency f1 and the second resonant frequency f2. In this case, the fmin and fmax are register values stored in the register 303, and may be set by an external controller or may be a fixed value.

The high order N bits of the counter value are output to the first comparator 305 and a second comparator 309. Whenever a clock signal from the clock unit 103 is input, the counter value of the up/down counter 301 is compared with the fmin register value and the fmax register value by the first comparator 305. If the comparison result indicates that the counter value of the up/down counter 301 is a boundary value of the frequency range, a control signal from the first comparator 305 is output to the up/down counter 301 and the count up/down operation of the up/down counter 301 is stopped.

Also, if a reset signal is provided to the up/down counter 301 from the reset unit 101, the up/down counter 301 sets the counter value to fmin.

Accordingly, if the comparison result of the output control voltage (Reference_Volt), which is a DC voltage, with the output voltage (Feed back) indicates that the output voltage is the higher value, the counter value of the up/down counter 301 decreases and the driving voltage frequency increases. Also, if the output voltage is the lower value, the counter value of the frequency control up/down counter 301 increases, and the driving voltage frequency decreases. As a result, the output voltage value is maintained to be constant relative to the output control voltage (Reference_Volt) (DC voltage) by keeping the frequency of the driving voltage at a desired driving voltage frequency (ftarget, refer to FIG. 6).

Also, when an output (i.e., the driving control signal from the controller 105) is in an OFF state, the output control voltage (Reference_Volt) becomes greater than the output voltage, and therefore the driving frequency gradually decreases to fmin and then stops. Meanwhile, when the output is in an ON state, the output control voltage (Reference_Volt) becomes less than the output voltage, and therefore the driving frequency gradually increases to be a target frequency (ftarget).

The register 303, which is an example embodiment of a changing range memory unit, stores the maximum value fmax and the minimum value fmin of the driving frequency of the piezoelectric transformer T201. Furthermore, the register 303 stores the counter up/down value X of the up/down counter 301. Also, the register 303 outputs the counter up/down value X to the up/down counter 301 or outputs the fmax or the fmin to the first comparator 305.

The high order N bits of the counter value of the up/down counter 301, and the values of the fmax and fmin are input to the first comparator 305. The first comparator 305 compares magnitudes of the counter value with the values of the fmax and fmin, and thereby determines whether the input counter value of the up/down counter 301 is the same as a value on a boundary of the frequency range of the piezoelectric transformer T201. If the high order N bits of the counter value are greater than the minimum value fmin of the frequency range, or less than the maximum value fmax, the first comparator 305 outputs a "high" logic level, and transmits an up/down stop signal which is a control signal to stop the count up/down operation of the up/down counter 301.

Referring back to FIG. 5, the piezoelectric transformer driving control unit 30 includes the driving voltage generation unit, which in turn includes an N-bit digital reset counter 307, a second comparator 309, a 1-bit counter 311, and AND gates 313 and 315. For synchronization with the up/down counter 301, the N-bit digital reset counter 307 (hereinafter referred to as an N-bit counter) has the same high-speed clock input from the clock unit 103 as the up/down counter 301. Whenever the clock signal is at the "high" logic level, a counter value of the N-bit counter 307 is increased by 1.

Also, if a "low" logic level signal is input to the reset input terminal of the N-bit counter 307, the N-bit counter 307 is reset and the counter value of the N-bit counter 307 becomes 0. The reset signal input to the N-bit counter 307 is generated by ANDing (in the AND gate 315) a system reset signal provided from the reset unit 101, which initializes all logic circuits when power is turned on, and an inverted version of an output signal (COMPARE_OUT) of the second comparator 309.

The output (COMPARE_OUT) of the second comparator 309 is at a "high" logic level when the counter value of the up/down counter 301, which is the counter value for frequency control, is the same as the counter value of the N-bit counter 307, which is the counter value for driving voltage generation. Accordingly, control of the driving voltage frequency is achieved by the counter value of the up/down counter 301.

That is, the counter value (the high order N bits) of the up/down counter 301, and the counter value of the N-bit counter 307 are input to the second comparator 309, and if the counter value of the N-bit counter 307 is equal to or greater than the counter value of the up/down counter 301, a "high" logic level is output. Also, if the reset signal from the reset unit 101 is input to the second comparator 309, the second comparator 309 is reset.

The 1-bit counter 311 is triggered by an output signal of the second comparator 309, and whenever the output of the second comparator 309 is at the "high" logic level, a output voltage from an output terminal thereof is inverted. The output signal of the 1-bit counter 311 is input to the AND gate 313. Also, the 1-bit counter 311 is reset if the reset signal from the reset unit 101 is input.

An inverted version of an ENABLE signal, which is an on/off control signal output from the controller 105, and the output signal output from the 1-bit counter 311 are input to the AND gate 313. According to the result of the operation of the AND gate 313, on/off control of a high-voltage power source output is performed. That is, if the ENABLE signal is at the "low" logic level, the driving voltage is output from the AND gate 313 without being inverted, and the high-voltage power source output is output. If the ENABLE signal is at the "high" logic level, the output of the AND gate 313 is forced to be at the "low" logic level, and output of the high-voltage power source output is stopped.

The reset signal from the reset unit 101 and an inverted version of the output signal (COMPARE_OUT) of the second comparator 309 are input to the AND gate 315, and the reset signal of the N-bit counter 307 is generated. The output of the AND gate 315 is input to the reset terminal of the N-bit counter 307.

Also, the piezoelectric transformer driving control unit 30 includes a (digital to analog) D/A converter 317 which converts the output signal of the controller 105 into an analog signal to generate the output control voltage (Reference_Volt). In this case, the D/A converter 317 is not limited to a specific type of a D/A converter, and a commonly used D/A converter can be employed as the D/A converter 317. The output control voltage (Reference_Volt) generated by a conversion process in the D/A converter 317 is input to the comparator 501 included in the output voltage detection unit 50. Also, instead of the D/A converter 317, a pulse width modulation (PWM) signal generator may be used.

The structure of the piezoelectric transformer type high-voltage power source apparatus 10 has been described above. Each element of the high-voltage power source apparatus 10 described above may be formed by using general-purpose modules or circuits, or may also be formed by using hardware customized to the function of each element. Accordingly, the structure thereof can be modified appropriately according to a required technology level.

FIGS. 7A-7J are first timing diagrams of a piezoelectric transformer type high-voltage power source apparatus according to an example embodiment of the present invention, and FIGS. 8A-8J are second timing diagrams of a piezoelectric transformer type high-voltage power source apparatus according to an example embodiment of the present invention. An operation of the piezoelectric transformer type high-voltage power source apparatus will now be explained in detail with reference to FIGS. 7A-7J and 8A-8J.

FIGS. 7A-7J explain a control operation timing chart in a period from a high-voltage output ready state to a target high-voltage output state (that is, an off state -> on -> a target high-voltage output state). Specifically, FIG. 7A shows a rest signal from a reset unit 101; FIG. 7B shows a clock signal generated from a clock unit 103; FIG. 7C shows an ENABLE signal from the controller 105 to activate the high-voltage power source apparatus; FIG. 7D shows an N-bit counter signal generated from an N-bit counter 307; FIG. 7E shows an up/down counter signal from the up/down counter 301; FIG. 7F shows a COMPARE_OUT signal from the second comparator 309; FIG. 7G shows a FREQ_OUT signal output from the piezoelectric transformer driving control unit 30; FIG. 7H show a Reference_Volt signal and a Feed_Back_Volt signal; FIG. 7I shows an UP/DOWN signal from a comparator 501; and FIG. 7J shows a FREQ_DRIVE_OUT output from the piezoelectric transformer.

In the high-voltage output ready state (or ready state), as illustrated in FIGS. 7A-7J, since the output control voltage (Reference_Volt) is greater than the output voltage (Feedback), the driving frequency (FREQ_OUT) is fmin. If the ENABLE signal is at the "low" logic level and the high-voltage power source apparatus is in an ON state, the output voltage (Feed_Back_Volt) (or Feedback) gradually goes up and an UP signal is input as the up/down signal into the up/down counter 301. Also, if the output voltage (Feed_Back_Volt) is greater than the output control voltage (Reference_Volt), a DOWN signal is output as the up/down signal, the up/down counter 301 decreases the counter value. In FIG. 7E, 'Cnt Down' indicates 'count-down' to decrease the counter value.

If the counter value of the up/down counter 301 decreases, an upper limit value of the count value of the N-bit counter 311 also decreases. As a result, the driving frequency (FREQ_OUT) moves from the fmin frequency toward the high frequency side until ftarget, which is a target driving frequency, is reached. In FIG. 7D, 'ft' in an N-bit counter refers to 'ftarget'.

FIGS. 8A-8J explain a control operation timing chart in a period from a target high-voltage output state to a high-voltage output ready state (a target high-voltage output state -> off -> a high-voltage output ready state). Specifically, FIG. 8A shows a rest signal from a reset unit 101; FIG. 8B shows a clock signal generated from a clock unit 103; FIG. 8C shows an ENABLE signal from the controller 105 to activate the high-voltage power source apparatus; FIG. 8D shows an N-bit counter signal generated from an N-bit counter 307; FIG. 8E shows an up/down counter signal from the up/down counter 301; FIG. 8F shows a COMPARE_OUT signal from the second comparator 309; FIG. 8G shows a FREQ_OUT signal output from the piezoelectric transformer driving control unit 30; FIG. 8H show a Reference_Volt signal and a Feed_Back_Volt signal; FIG. 8I shows an UP/DOWN signal from a comparator 501; and FIG. 8J shows a FREQ_DRIVE_OUT output from the piezoelectric transformer.

As illustrated in FIGS. 8A-8J, in the state in which the target high-voltage is output, the N-bit counter 307 and the up/down counter 301 continue to count until the counter value becomes ftarget ft, and the output voltage (Feed_Back_Volt) becomes similar to the output control voltage (Reference_Volt). Here, if the ENABLE signal is at the "high" logic level and the high-voltage power source apparatus is in an OFF state, the value of the output voltage (Feed_Back_Volt) gradually decreases and the value of the output control voltage (Reference_Volt) increases. As a result, an UP signal is output as the up/down signal, and therefore the up/down counter increases the counter value. In FIG. 8E, 'CntUp' indicates 'count-up' to increase the counter value.

As illustrated in FIG. 8E, if the counter value of the up/down counter 301 increases, the upper limit value of the count value of the N-bit counter 307 also increases accordingly. As a result, the driving frequency (FREQ_OUT), shown in FIG. 8G moves from the ftarget frequency toward the low frequency side until the fmin frequency is reached, which is a frequency at which a maximum output voltage occurs.

Turning more to an image forming apparatus in which the piezoelectric transformer type high-voltage power source apparatus according an example embodiment of the present invention is utilized, such an image forming apparatus is typically provided with a charging unit (not shown) to charge a surface of a latent image supporter (not shown), an exposure unit (not shown) to form a latent image on the surface of the latent image supporter after the charging thereof, a developing unit (not shown) to develop the latent image, and a transfer unit (not shown) to transfer a toner image formed on the latent image supporter to a transfer material (not shown).

The charging unit, the developing unit, and the transfer unit are provided with a predetermined bias (or voltage) from a high-voltage power source apparatus as shown, for example, in FIG. 4. In other words, the image forming apparatus employs the piezoelectric transformer type high-voltage power source apparatus shown in FIG. 4 as a power source apparatus for providing a voltage to at least one of the charging unit, the developing unit, and the transfer unit.

Since the piezoelectric transformer type high-voltage power source apparatus 10 can stably perform frequency control without falling into an abnormal oscillation or an uncontrollable state, the charging unit, the developing unit, and the transfer unit of the image forming apparatus using the piezoelectric transformer type high-voltage power source apparatus 10 can be stably operated. Also, since a high-voltage can be output within a short rise time, time required for each process of the image forming apparatus can be reduced.

Figure 9:
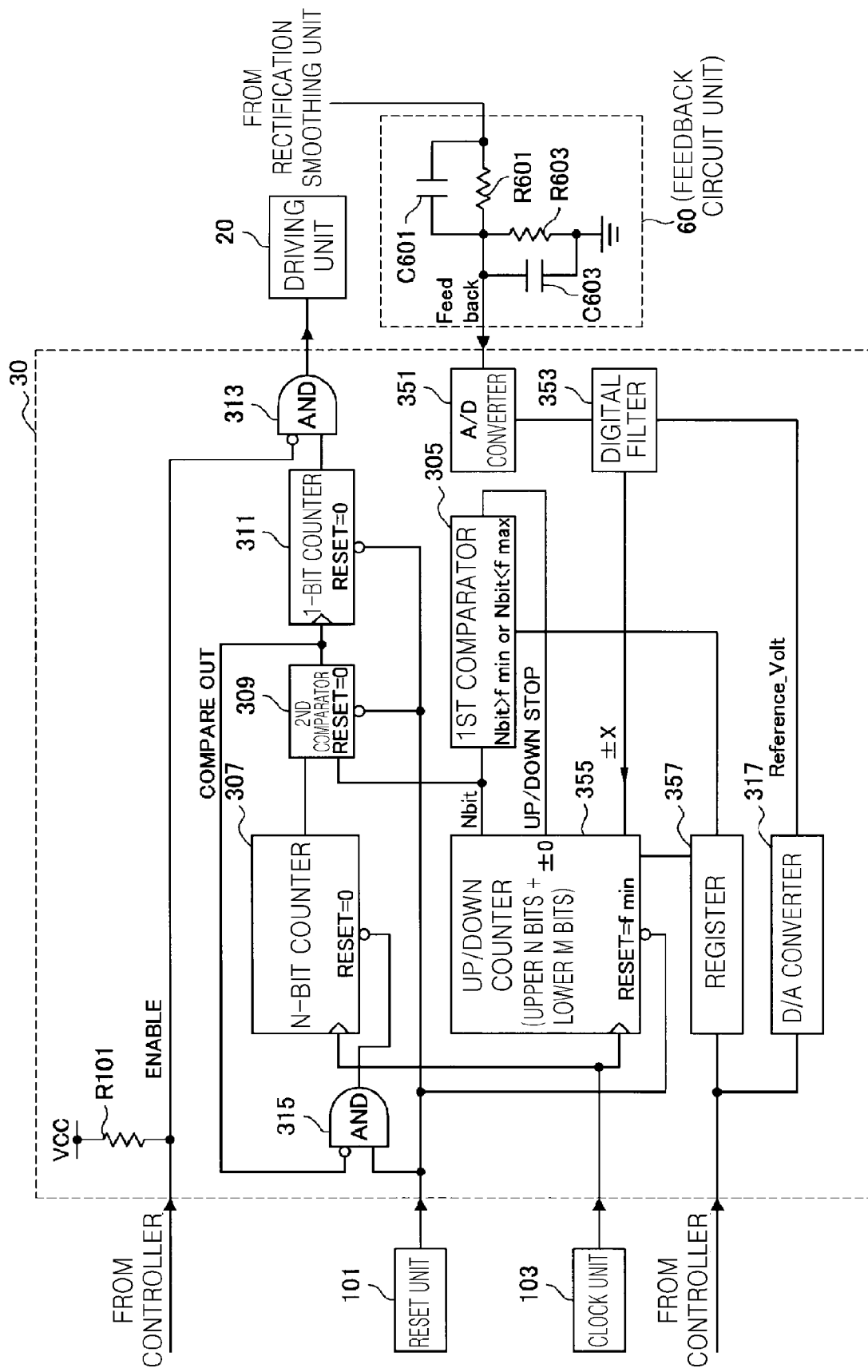
FIG. 9 is a block diagram of a modified piezoelectric transformer driving unit of a piezoelectric transformer type high-voltage power source apparatus according to an example embodiment of the present invention.

FIG. 9 is a block diagram of another example embodiment of a piezoelectric transformer driving control unit 30 shown in FIG. 4. As shown in FIG. 9, a feedback circuit unit 60 is also provided. The driving unit 20 and the rectification smoothing unit 40 have the same structures and functions as those of the driving unit 20 and the rectification smoothing unit 40, respectively, in the piezoelectric transformer type high-voltage power source apparatus shown in FIG. 4 and FIG. 5, and therefore, a detailed explanation thereof will be omitted. However, the piezoelectric transformer driving control unit 30 shown in FIG. 9 is designed to control the frequency of a driving voltage controlling the piezoelectric transformer T201 of the driving unit 20. As a result, the piezoelectric transformer is characterized by the fact that the driving frequency of the piezoelectric transformer T201 is controlled by digital signal processing technique performed by the piezoelectric transformer driving control unit 30.

The feedback circuit unit 60 includes capacitors C601 and C603 and resistors R601 and R603. The output voltage, which is rectified and smoothed to a direct current (DC) voltage by the rectification smoothing unit 40 is divided by the voltage divider resistors R601 and R603 and is input to the piezoelectric transformer driving control unit 30 without being inverted as an analog signal. Also, the capacitors C601 and C603 connected in parallel to the voltage divider resistors R601 and R603, respectively, adjust the AC and DC components of the output voltage.

In addition, a reset unit 101 is provided to generate a reset signal; a clock unit 103 is provided to generate a clock signal; and a controller 105 is provided to generate a driving control signal of the piezoelectric transformer T201. The driving control signal (on/off signal) provided from the controller 105 is inverted by the resistors R101 (not shown), R103, or R105 or a switching device S101, and is converted to an open collector output and input to the piezoelectric transformer driving control unit 30.

The piezoelectric transformer driving control unit 30 will now be explained in detail with reference to FIG. 9. The piezoelectric transformer driving control unit 30 includes a driving frequency control unit to vary and control the frequency of a driving voltage to drive the piezoelectric transformer T201, and a driving voltage generation unit to generate the driving voltage.

Referring to FIG. 9, the piezoelectric transformer driving control unit 30 includes driving frequency control unit, which in turn includes a first comparator 305, an A/D converter 351, a digital filter 353, and an up/down counter 355. The A/D converter 351 converts a feedback signal, which is an analog signal that is output from the feedback circuit unit 60, into a digital signal. The A/D converter 351 is not limited to a specific type of an A/D converter, and a commonly used A/D converter can be employed as the A/D converter 351. The feedback signal, which is converted into a digital signal by the A/D converter 351, is output to the digital filter 353.

The feedback signal and a Reference_Volt signal from the D/A converter 317 are input to the digital filter 353, which performs calculation of a digital value. The digital filter 353 performs a comparison operation of the input feedback signal and the Reference_Volt signal, and calculates a counter up/down value X. The calculated counter up/down value X is output to the up/down counter 355.

A high-speed clock signal, which is generated according to a required frequency control precision degree, is provided to the up/down counter 355 from the clock 103. Whenever the clock signal is at the "high" logic level, a counter value of the up/down counter 355 is increased by the counter up/down value X provided from the digital filter 353. That is, if a signal from the digital filter 353 indicating that the counter value is to be increased by X is transmitted, the up/down counter 355 increases the counter value by X, and if a signal from the digital filter 353 indicating that the counter value is to be decreased by X is transmitted, the up/down counter 355 decreases the counter value by X.

Also, the number of bits of a frequency control counter may have a format of {a number of bits of a driving voltage generation counter (N)+low order M bits, (N+M)} by setting the low order M bits values, thereby correcting an a gain of an error feedback voltage (or error detection voltage) and enabling stable control. Even when magnitudes of the output voltage (Feedback) and the output control voltage (Reference_Volt) are similar to each other and a change in value of the up/down counter 355 becomes very small, if the number of bits of the frequency control counter is formed to be (N+M), the high order N bits do not change even when the low order M bits change. Accordingly, counting by the up/down counter 355 can be performed stably.

Also, as with the up/down counter 301, the counter value of the up/down counter 355 used for controlling the frequency would converge on the frequency range illustrated in FIG. 6. The frequency range can be obtained by taking an fmin value (which is a frequency value reflecting a manufacturing irregularity of the piezoelectric transformer in the first resonant frequency f1 as a minimum frequency, and an fmax value (which is the frequency value immediately before the output voltage curve goes up between the first resonant frequency f1 and the second resonant frequency f2) as a maximum frequency. In this case, fmin and fmax are register values stored in the register 357, and may be set by an external controller or may be a fixed value.

The high order N bits of the counter value are output to the first comparator 305 and a second comparator 309. Whenever a clock signal from the clock unit 103 is input, the counter value of the up/down counter 305 is compared with the fmin register value and the fmax register value by the first comparator 305. If the comparison result indicates that the counter value of the up/down counter 355 is a boundary value of a frequency range, a control signal from the first comparator 305 is output to the up/down counter 355 and the count up/down operation of the up/down counter 355 is stopped. Also, if the reset signal is provided to the up/down counter 355 from the reset unit 101, the up/down counter 355 sets the counter value to the fmin value.

Accordingly, if the comparison result of the output control voltage (Reference_Volt) (which is a DC voltage) with the output voltage (Feedback) indicates that the output voltage is the higher value, the counter value of the up/down counter 355 decreases and the driving voltage frequency increases. Also, if the output voltage is the lower value, the counter value of the frequency control up/down counter 355 increases, and the driving voltage frequency decreases. As a result, the output voltage value is maintained to be constant relative to the Reference_Volt (DC voltage) by a desired driving voltage frequency (ftarget, refer to FIG. 6).

Also, when an output from an output terminal of the controller 105 is in an OFF state, the output control voltage (Reference_Volt) becomes greater than the output voltage, and therefore, the driving frequency gradually decreases to the fmin value and then stops decreasing. Meanwhile, when the output of the controller 105 is in an ON state, the output control voltage (Reference_Volt) becomes less than the output voltage, and therefore, the driving frequency gradually increases until a target frequency (ftarget) is reached.

The register 357, which is an example embodiment of a changing range memory unit, stores the maximum value fmax and the minimum value fmin of the driving frequency of the piezoelectric transformer T201. In this case, the register 357 outputs the fmax value or the fmin value to the first comparator 305. The comparator 305 has the same structure and effect as the comparator 305 of the piezoelectric transformer type high-voltage power source apparatus 10, and therefore a detailed explanation of the comparator 305 will not be repeated.

Referring back to FIG. 9, piezoelectric transformer driving control unit 30 includes the driving voltage generation unit, which in turn includes an N-bit digital reset counter (an N-bit counter) 307, a second comparator 309, a 1-bit counter 311, and AND gates 313 and 315. The driving voltage generation unit of FIG. 9 has the same structure and effect as the driving voltage generation unit of FIG. 5, and therefore, a detailed explanation thereof will not be repeated.

Also, the piezoelectric transformer driving control unit 30 includes a D/A converter 317 which converts the output signal of the controller 105 into an analog signal, Reference_Volt. The D/A converter 317 is not limited to a specific type of a D/A converter, and a commonly used D/A converter can be employed as the D/A converter 317. The signal Reference_Volt generated by a conversion process in the D/A converter 317 is input to the digital filter 353.

When describing the piezoelectric transformer driving control unit 30 as shown in FIG. 9, it was discussed that the feedback voltage, which is an analog form of a change amount provided from the feedback circuit unit 60, is converted into digital data by the A/D converter 351, and the change is sampled and processed by the digital filter 353. However, this example embodiment of the present invention is not limited to this process, and in relation to the feedback voltage, which is an analog form of change amount provided from the feedback circuit unit 60, the change can also be calculated through a proportional-integral-derivative (PID) controlling technique.

The structure of the piezoelectric transformer type high-voltage power source apparatus 10 has been described above. Each element of the high-voltage power source apparatus described above may be formed by using general-purpose modules or circuits, or may also be formed by using hardware customized to the function of each element. Accordingly, the structure thereof can be modified appropriately according to a required technology level.

In order to solve problems of the typical piezoelectric transformer type high-voltage power source apparatus as described in connection with FIG. 1, a piezoelectric transformer type high-voltage power source apparatus according another example embodiment of the present invention is designed to control a driving frequency of a piezoelectric transformer by a digital signal processing technique, and stabilize the operation of the piezoelectric transformer, in order to realize a high-voltage output within a short rise time. Also, in addition to controlling the driving frequency of the piezoelectric transformer, by controlling a power source voltage applied to the piezoelectric transformer, efficiency of generating an output voltage obtained from the piezoelectric transformer can be improved. The piezoelectric transformer type high-voltage power source apparatus 10 according to another example embodiment will now be explained with reference to FIGS. 10 through 15 herein below.

Figure 10:
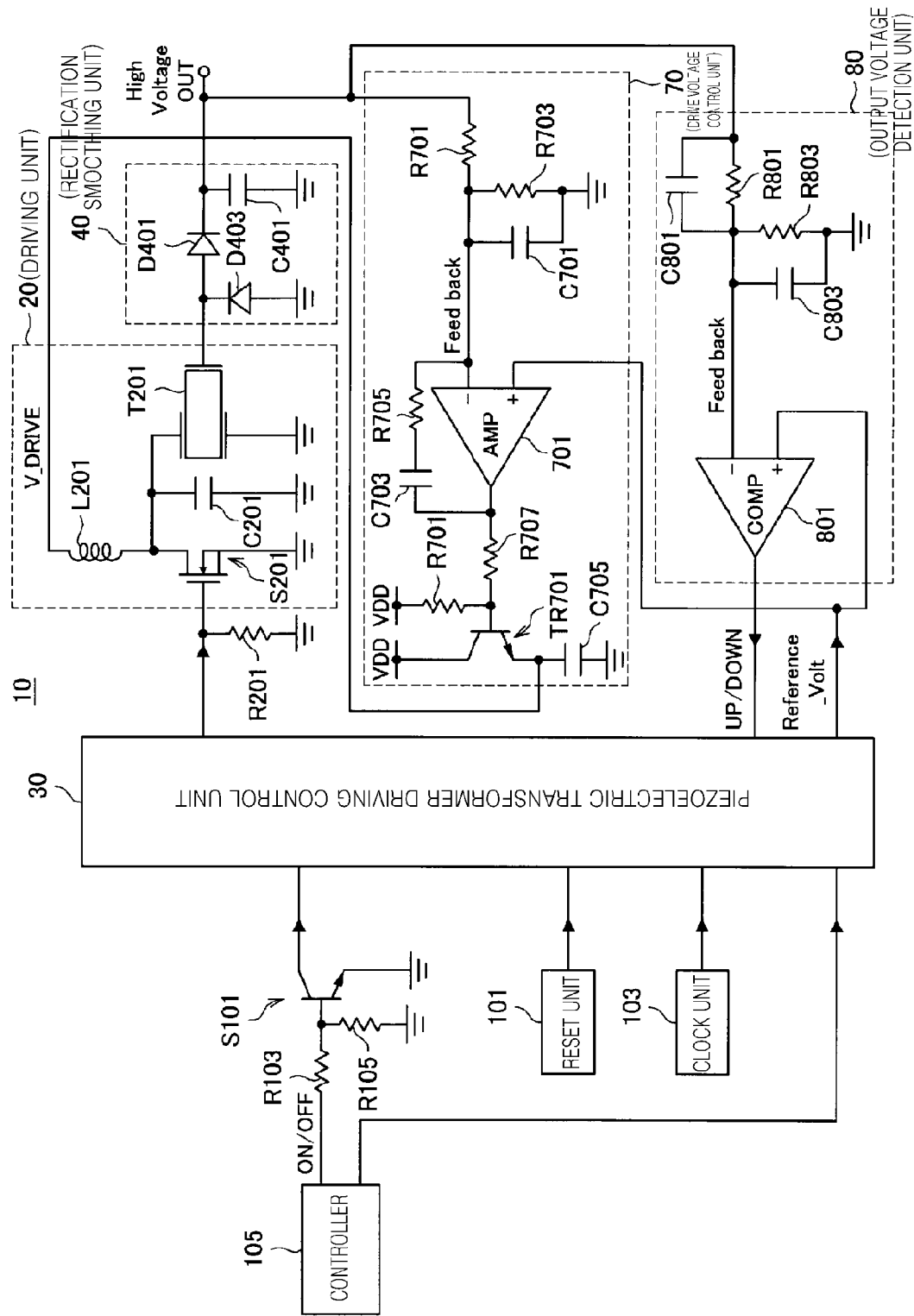
FIG. 10 is a block diagram of a piezoelectric transformer type high-voltage power source apparatus according to another example embodiment of the present invention.
Figure 11:
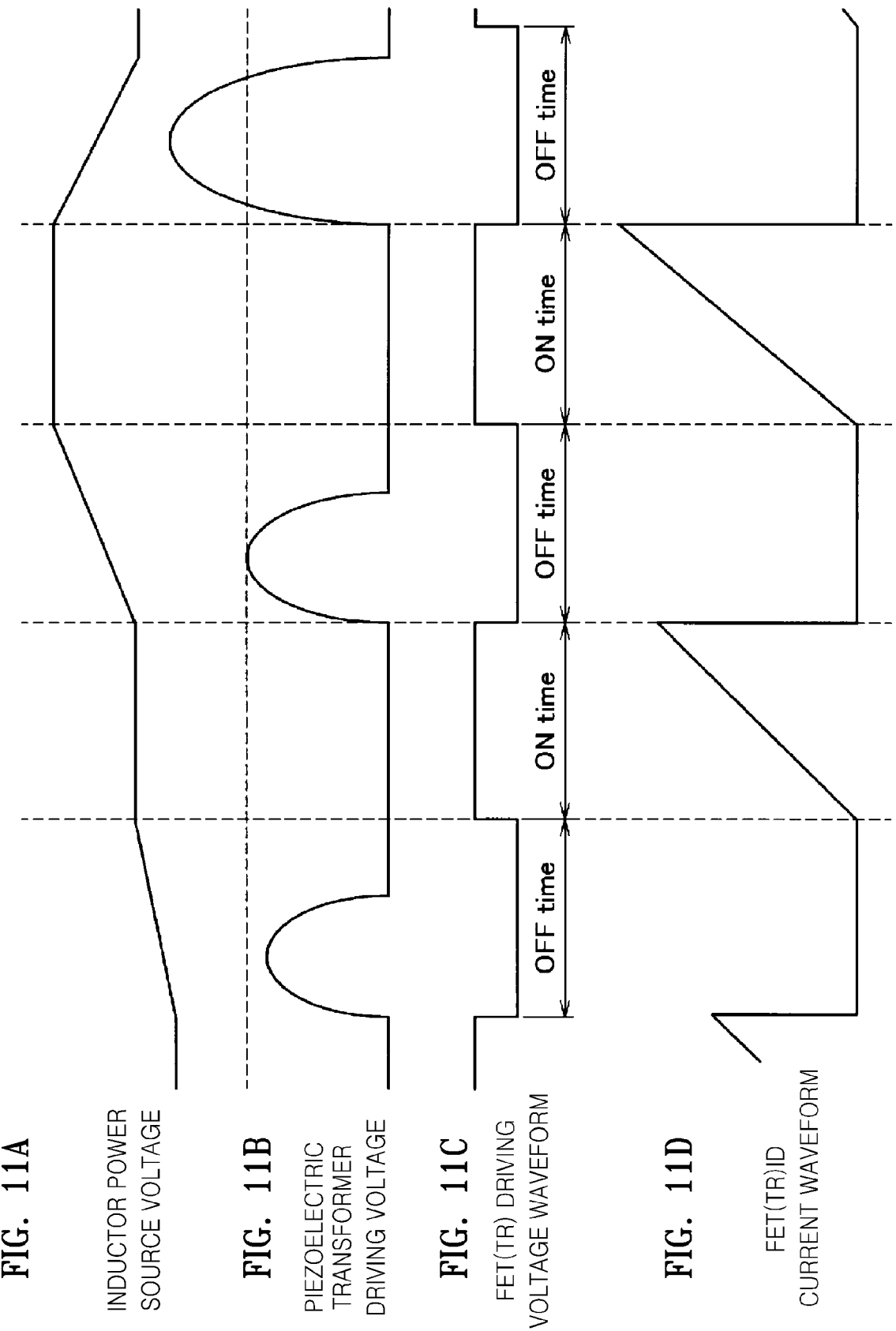
FIGS. 11A-11D illustrates a diagram of a relationship between an inductor power source voltage and an operational waveform appearing when a voltage is raised in a piezoelectric transformer type high-voltage power source apparatus according to an example embodiment of the present invention.

FIG. 10 is a block diagram of a piezoelectric transformer type high-voltage power source apparatus 10 according to another example embodiment of the present invention. As shown in FIG. 10, the high-voltage power source apparatus 10 includes a driving unit 20, a piezoelectric transformer driving control unit 30, a rectification smoothing unit 40, a drive voltage control unit 70, and an output voltage detection unit 80.

The driving unit 20 includes a piezoelectric transformer T201, an inductor L201, a resistor R201, and a MOSFET switching device S201. In the driving unit 20, if a power source voltage (V_DRIVE provided from the drive voltage control unit 70 is connected to the inductor L201, a driving voltage that is frequency-controlled by the piezoelectric transformer driving control unit 30 is input to the switching device S201 in order to control on/off states of the switching device S201, thereby raising the voltage (V_DRIVE output from the drive voltage control unit 70, or converting the voltage (V_DRIVE output from the drive voltage control unit 70 to a pseudo sine wave. Then, the converted voltage is applied to the piezoelectric transformer T201.

The piezoelectric transformer T201 of the driving unit 20 has a piezoelectric vibrating body having a primary electrode (not shown) disposed at a primary side, and a secondary electrode (not shown) disposed at a secondary side. At primary side, the piezoelectric transformer T201 is polarized in a width direction and polarized ends thereof face each other with the vibrating body disposed between the polarized ends. At the secondary side, the piezoelectric transformer T201 is polarized in a length direction. These are accommodated in a resin case (not shown). The piezoelectric vibrating body is made of piezoelectric ceramic, such as, plumbum(lead)-zirconate-titanate (PZT), and has a plate shape. In the length direction of the piezoelectric vibrating body, the primary electrode is disposed from one end to, for example, the middle of the piezoelectric vibrating body, and the secondary electrode is disposed at the other end. If a driving voltage having a proper resonant frequency (which is determined by a length measure) is applied to the primary side, a strong mechanical resonance is induced due to an inverse piezoelectric effect, and a high output voltage corresponding to the vibration is output due to a piezoelectric effect.

FIGS. 11A-11D illustrates a diagram of a relationship between an inductor power source voltage and an operational waveform appearing when a voltage is raised in a piezoelectric transformer type high-voltage power source apparatus 10 shown in FIG. 10. Specifically, FIG. 11A shows an inductor power source voltage; FIG. 11B shows piezoelectric transformer driving voltage, FIG. 11C shows an FET(TR) driving voltage waveform; and FIG. 11D shows an FET(TR) current waveform. The relationship between the inductor power source voltage and the operational waveform appearing when the voltage is raised will now be explained in detail with reference to FIGS. 11A-11D.

If a driving voltage (illustrated in FIG. 11C) from the piezoelectric transformer driving control unit 30 is applied to the switching device S201 (FET or transistor), the switching device S201 switches to an ON state, and a current flows through the inductor L201. In this case, in the switching device S201, a current (illustrated in FIG. 11D, (I)=driving voltage (ON time/L), where L is an inductance of the inductor L201) flows.

Accordingly, the current (I) with respect to the magnitude of the power source voltage (V_DRIVE) flows, and in the inductor L201, energy ((U)=½ (LI$^2$)) is accumulated. Then, if the switching device S201 switches to an OFF state, a resonance is induced between the capacitor C201 and the inductor L201 connected to the primary side. In this case, a magnitude of the voltage applied to the piezoelectric transformer T201 increases according to the amount of energy (U) accumulated in the inductor L201. Accordingly, if the inductor power source voltage, i.e., the power source voltage (V_DRIVE), provided from the drive voltage control unit 70, is increased, the output from the piezoelectric transformer T201 can be increased.

Referring back again to FIG. 10, the piezoelectric transformer driving control unit 30 controls the frequency of the driving voltage controlling the piezoelectric transformer T201 of the driving unit 20. The piezoelectric transformer type high-voltage power source apparatus 10 of FIG. 10 is characterized by the fact that the driving frequency of the piezoelectric transformer T201 is controlled by a digital signal processing technique performed by this piezoelectric transformer driving control unit 30. This piezoelectric transformer driving control unit 30 will be explained later in more detail.

The rectification smoothing unit 40 includes a capacitor C401 and diodes D401 and D403. The AC output of the piezoelectric transformer T201 is rectified and smoothed to a constant voltage (DC voltage) by the diodes D401 and D403 and the capacitor C401, and provided to a load, such as a transfer roller (not shown).

The drive voltage control unit 70 includes capacitors C701, C703, and C705, resistors R701, R703, R705, and R707, a transistor TR701 such as a bipolar transistor, and an operational comparator amplifier (AMP) 701. The output voltage rectified and smoothed to a DC voltage by the rectification smoothing unit 40 is divided by the voltage divider resistors R701 and R703, and is input to an inverted input terminal (− terminal) of the operational comparator amplifier 701 as an output voltage (Feedback). Also, to the non-inverted input terminal (+ terminal) of the operational comparator amplifier 701, an output control voltage (which is a DC voltage controlling an output voltage) is input as a reference voltage (Reference_Volt).

The operational comparator amplifier 701 compares magnitudes of the input output voltage (Feedback) and the output control voltage (Reference_Volt), and according to the comparison result, increases or decreases a voltage value. More specifically, if Feedback is greater than Reference_Volt, the operational comparator amplifier 701 decreases the voltage value, and if Feedback is less than Reference_Volt, the operational comparator amplifier 701 increases the voltage value. The current of an output of the operational comparator amplifier 701 is increased by a transistor buffer, and the output of the operational comparator amplifier 701 becomes the supply power source voltage (V_DRIVE) output to the inductor L201 in the driving unit 20. The magnitude of the output voltage output from the piezoelectric transformer T201 relies on a value of the driving frequency applied to the piezoelectric transformer T201, and also relies on a magnitude of the power source voltage (V_DRIVE) provided to the piezoelectric transformer T201.

Figure 12:
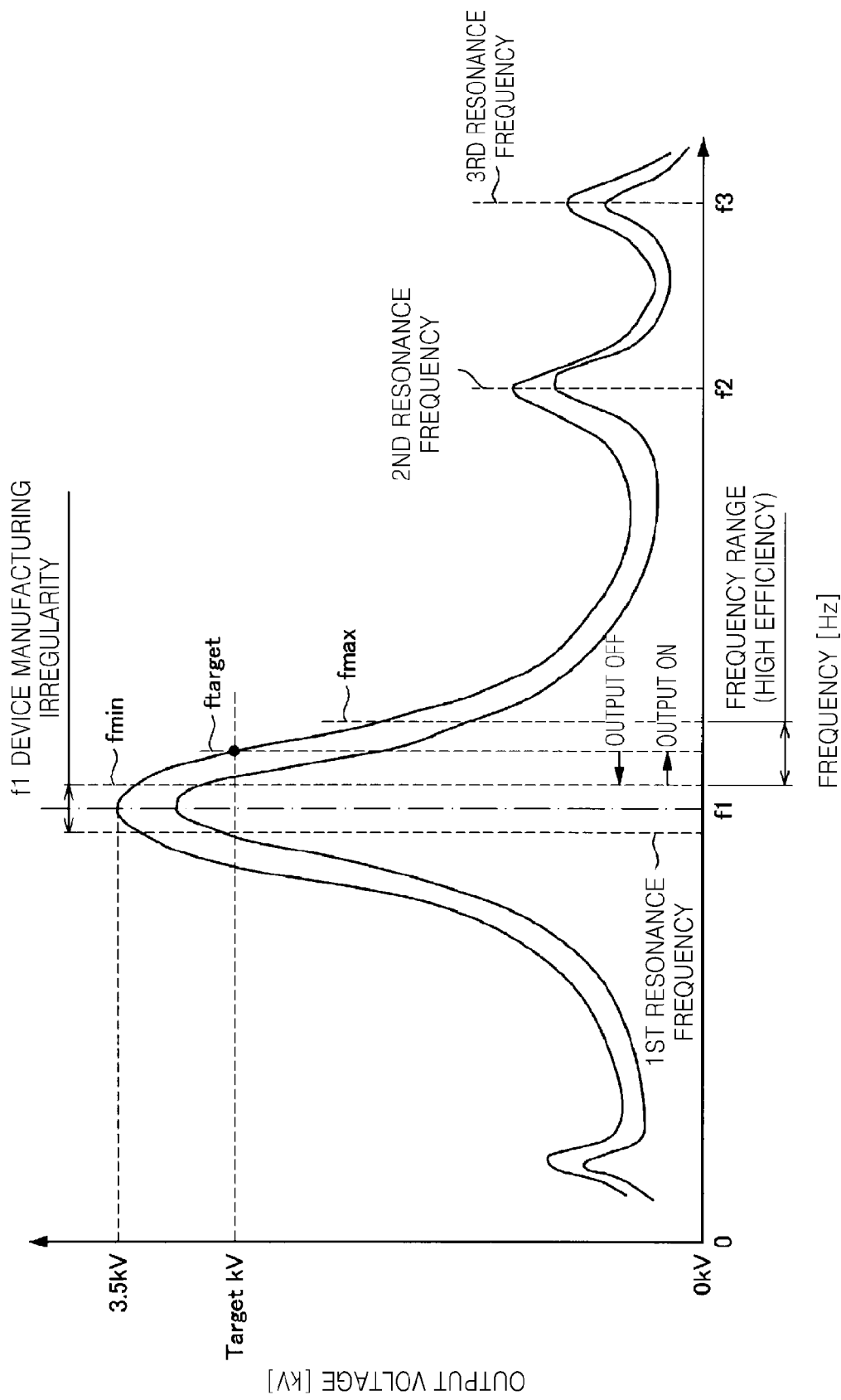
FIG. 12 is a waveform diagram of a driving frequency of a piezoelectric transformer type high-voltage power source apparatus according to an example embodiment of the present invention.

FIG. 12 is a waveform diagram of a driving frequency of a piezoelectric transformer in a piezoelectric transformer type high-voltage power source apparatus as shown in FIG. 10. As illustrated in FIG. 12, magnitude of an output voltage of the piezoelectric transformer varies with respect to magnitude of the power source voltage provided to the piezoelectric transformer. For example, when an identical driving frequency is applied to the piezoelectric transformer, a higher output voltage can be obtained by supplying a higher supplied power source voltage. Accordingly, when a predetermined output power is desired to be obtained from a piezoelectric transformer, the predetermined output power can be achieved not only by controlling the driving frequency applied to the piezoelectric transformer, but also by controlling the power source voltage applied to the piezoelectric transformer.

Accordingly, in the piezoelectric transformer type high-voltage power source apparatus 10 as shown in FIG. 10, magnitudes of the output voltage from the piezoelectric transformer T201 and the output control voltage are compared as described above, and thereby the power source voltage (V_DRIVE) provided to the inductor L201 is varied and controlled. At the same time, by concurrently controlling the driving frequency applied to the piezoelectric transformer T201, a targeted output voltage can be more efficiently obtained from the piezoelectric transformer T201.

For example, when a low output voltage is required, in the typical apparatus in which a predetermined voltage is provided to an inductor, the driving frequency applied to a piezoelectric transformer would be shifted to the high frequency side, and an inefficient frequency range in the vicinity of a second resonant frequency f2 would be used if the required output voltage is too low to be obtained from within the efficient frequency range. However, in the piezoelectric transformer type high-voltage power source apparatus 10, the power source voltage applied to the inductor L201 can be lowered, as shown in FIG. 12, and thereby lower frequencies may be reached in an efficient frequency range in the vicinity of the fmin.

Also, although FIG. 12 only show two curves illustrating the relationship between the driving frequency and the output voltage, a relationship between the curves is not limited to only those shown, and according to the value of the provided power source voltage (V_DRIVE), more curves are available based on the provided power source voltage (V_DRIVE). Also, in the drive voltage control unit 70 according to this example embodiment, if an ON/OFF control signal from the controller 105 becomes a signal indicating OFF, the voltage provided to the inductor L201 is controlled to be a maximum voltage.

Referring back again to FIG. 10, the output voltage detection unit 80 includes capacitors C801 and C803, resistors R801 and R803, and a comparator (COMP 801. The output voltage, which is rectified and smoothed to a DC voltage by the rectification smoothing unit 40, is divided by the voltage divider resistors R801 and R803 in the output voltage detection unit 80 and is input to an inverted input terminal (− terminal) of the comparator 801 as an error detection voltage (Feedback). In this case, the capacitors C801 and C803 connected in parallel to the voltage divider resistors R801 and R803, respectively, adjust the AC and DC components of the output voltage. Also, a voltage which is a DC voltage to control the output voltage is input as an output control voltage (Reference_Volt) to the non-inverted input terminal (+ terminal) of the comparator 801.

The comparator 801 compares magnitudes of the output control voltage (Reference_Volt) and the output voltage (Feedback), and outputs a comparison result. If the output of the comparator 801 indicates the output voltage (Feedback) is greater than the output control voltage (Reference_Volt), the output of the comparator 801 is at a "low" logic level, and if the output voltage (Feeback) is less than the output control voltage (Reference_Volt), the output of the comparator 501 is at a "high" logic level. Due to the comparator 801, an analog change in the output voltage can be represented by a digital value. The digital value output from the comparator 801 is a control signal (UP/DOWN) to control the frequency control unit in the piezoelectric transformer driving control unit 30, and is input to the piezoelectric transformer driving control unit 30.

Also, the piezoelectric transformer type high-voltage power source apparatus 10 as shown in FIG. 10 includes a reset unit 101 to provide a reset signal, a clock unit 103 to provide a clock signal, and a controller 105 to provide a driving control signal to the piezoelectric transformer T201. The driving control signal (ON/OFF signal) provided from the controller 105 is inverted by the resistors R101 (not shown), R103, and R105 and the switching device S101, is converted to an open collector output, and is input to the piezoelectric transformer driving control unit 30.

Figure 13:
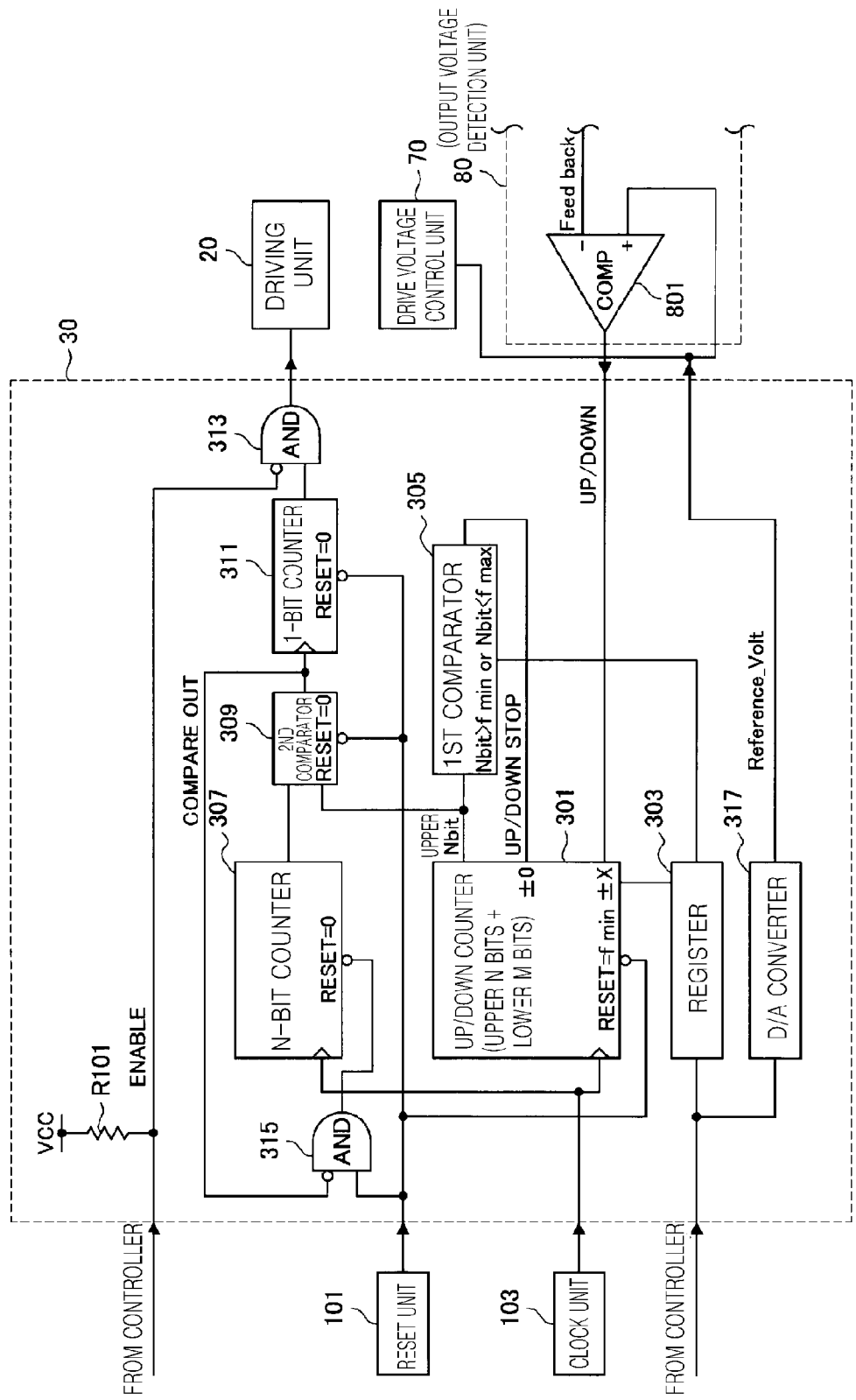
FIG. 13 is a block diagram of a piezoelectric transformer driving unit of a piezoelectric transformer type high-voltage power source apparatus according to an example embodiment of the present invention.
Figure 14:
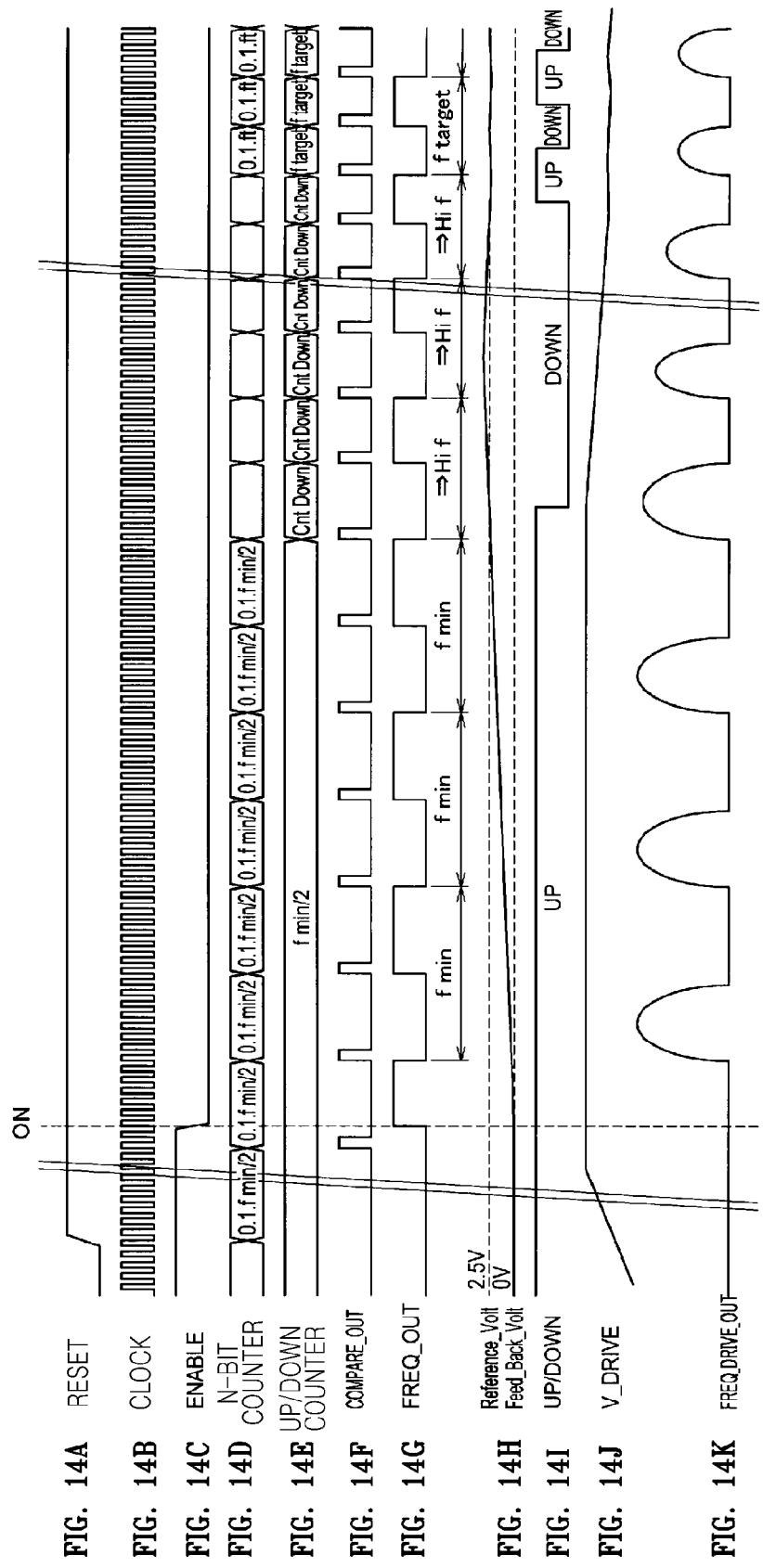
FIGS. 14A-14K illustrate first timing diagrams of a piezoelectric transformer type high-voltage power source apparatus according to an example embodiment of the present invention.
Figure 15:
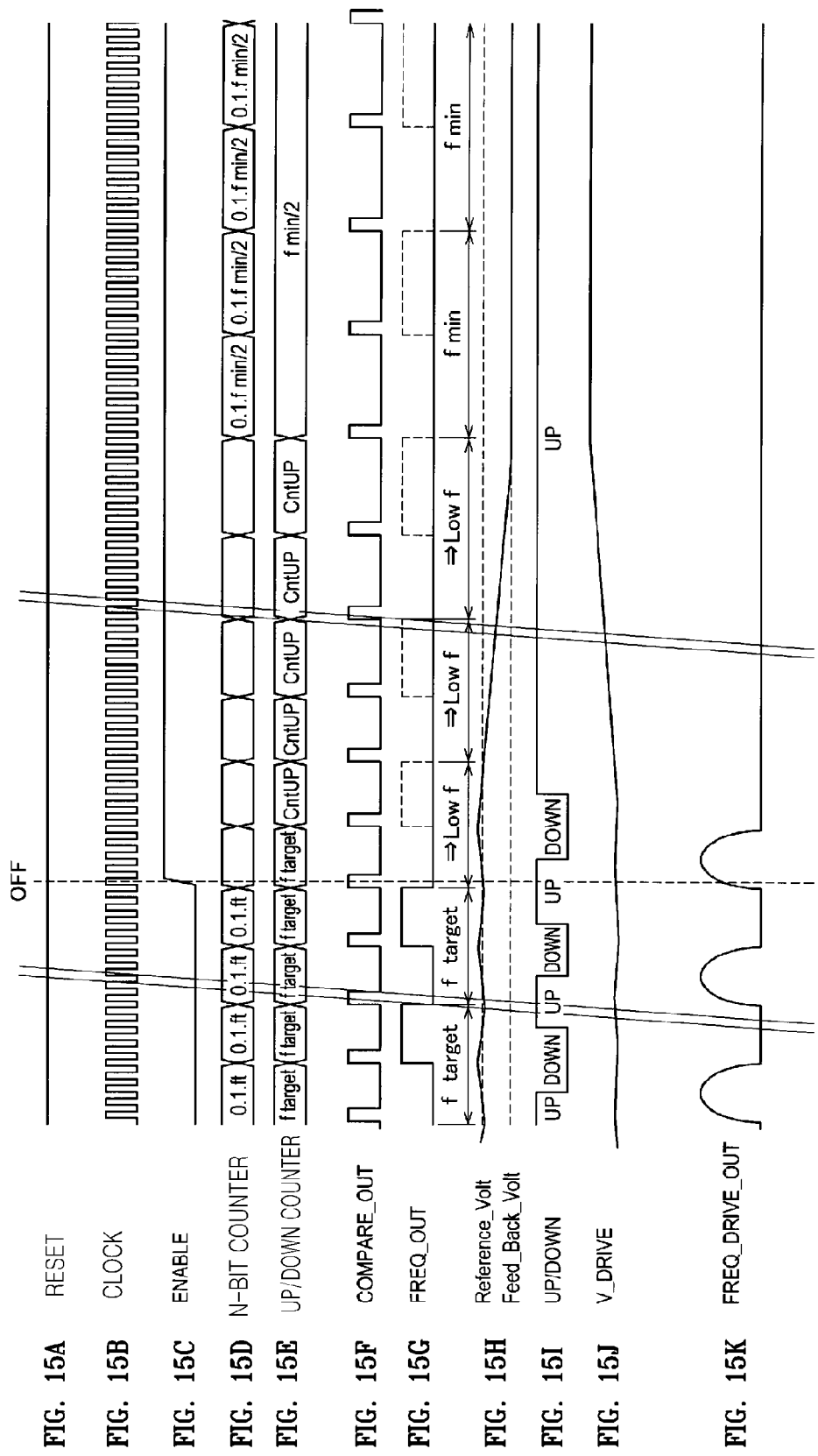
FIGS. 15A-15K illustrate second timing diagrams of a piezoelectric transformer type high-voltage power source apparatus according to an example embodiment of the present invention.

FIG. 13 is a block diagram of another embodiment of a piezoelectric transformer driving unit 30 shown in FIG. 10. As shown in FIG. 13, the piezoelectric transformer driving control unit 30 includes a driving frequency control unit to vary and control the frequency of a driving voltage for driving the piezoelectric transformer T201, and a driving voltage generation unit to generate a driving voltage.

Referring to FIG. 13, the piezoelectric transformer driving unit 30 of FIG. 13 includes the driving frequency control unit, which in turn includes an up/down counter 301, a register 303, and a first comparator 305. A high-speed clock signal, which is generated according to a required frequency control precision degree, is provided to the up/down counter 301 from the clock unit 103. Whenever the clock signal is at a "high" logic level, and if the output voltage detection signal (UP/DOWN) from the output voltage detection unit 80 is at a "high" logic level, a counter value is increased by X. In addition, whenever the clock signal is at the "high" logic level, and if the output voltage detection signal (UP/DOWN) is at a "low" logic level, the counter value is decreased by X.

Also, a number of bits of a frequency control counter may have a format of {a number of bits of a driving voltage generation counter (N)+low order M bits, (N+M)} by setting the low order M bits values, thereby correcting a gain of an error feedback voltage and enabling stable control. Even when magnitudes of the output voltage (Feedback) and the output control voltage (Reference_Volt) are similar to each other and the change of the up/down counter 301 becomes very small, if the number of bits of the frequency control counter is formed to be (N+M), the high order N bits do not change even when the low order M bits change. Accordingly, counting by the up/down counter 301 can be performed stably.

Here, the counter up/down value X is a register value that can be freely set in order to correct a gain of an error feedback voltage, and can be set by an external controller (not shown), or may be a fixed value. The set value of the counter up/down value X is stored in the register 303 and referred to by the up/down counter 301 whenever necessary.

Referring back to FIG. 12, the output voltage varies with respect to the frequency of a driving voltage applied to the piezoelectric transformer T201. The output voltage of the piezoelectric transformer T201 has 3 extreme values (resonant points) as illustrated in FIG. 12. In the vicinity of a first resonant frequency f1 at the low frequency side, the highest output voltages are given, and as the frequency of the driving voltage moves to a second resonant frequency f2 and a third resonant frequency f3 at the high frequency side, the value of the output voltage decreases. Accordingly, in order to most efficiently obtain the output voltage of the piezoelectric transformer T201, the driving frequency in the vicinity of the first resonant frequency f1 may be used.

Therefore, a counter value of the up/down counter 301 which is used for controlling a frequency would converge on the frequency range illustrated in FIG. 6. The frequency range can be obtained by taking an fmin value, which is a frequency value reflecting a manufacturing irregularity of the piezoelectric transformer in the first resonant frequency f1, as a minimum frequency, and a fmax value, which is the frequency value immediately before the output voltage curve goes up between the first resonant frequency f1 and the second resonant frequency f2, as a maximum frequency. In this case, fmin and fmax are register values stored in the register 303, and may be set by an external controller or may be a fixed value.

The high order N bits of the counter value of the up/down counter 301 are output to the first comparator 305 and a second comparator 309. Whenever a clock signal from the clock unit 103 is input, the first comparator 305 compares the counter value of the up/down counter 301 with the fmin register value and the fmax register value. If the comparison result indicates that the counter value of the up/down counter 301 is a boundary value of the frequency range, a control signal from the first comparator 305 is output to the up/down counter 301 and the count up/down operation of the up/down counter 301 is stopped. Also, if the reset signal is provided to the up/down counter 301 from the reset unit 101, the up/down counter 301 sets the counter value to the fmin.

Accordingly, if the comparison result of the output control voltage (Reference_Volt), which is a DC voltage, with the output voltage (Feedback) indicates that the output voltage is the higher value, the counter value of the up/down counter 301 decreases and the driving voltage frequency increases. Also, if the comparison result indicates that the output voltage is the lower value, the counter value of the frequency control up/down counter 301 increases, and the driving voltage frequency decreases. As a result, the output voltage value is maintained to be constant relative to the output control voltage (Reference_Volt) (DC voltage), by a targeted driving voltage frequency (ftarget, refer to FIG. 12).

Also, when the output of the controller 105 is in an OFF state, the output control voltage (Reference_Volt) becomes greater than the output voltage, and therefore, the driving frequency gradually decreases until fmin is reached and then stops decreasing. Meanwhile, when the output of the controller 105 is in an ON state, the output control voltage (Reference_Volt) becomes less than the output voltage, and therefore, the driving frequency gradually increases until a target frequency (ftarget) is reached.

The register 303, which is an example embodiment of a changing range memory unit, stores the maximum value fmax and the minimum value fmin of the driving frequency of the piezoelectric transformer T201. Furthermore, the register 303 stores the counter up/down value X of the up/down counter 301. Also, the register 303 outputs the counter up/down value X to the up/down counter 301 or outputs fmax or fmin to the first comparator 305.

The high order N bits of the counter value of the up/down counter 301, fmax and fmin are input to the first comparator 305, which is an example embodiment of a frequency range control unit. The first comparator 305 compares magnitudes of the counter value, fmax and fmin, and thereby determines whether an input counter value is a boundary value of the frequency range of the piezoelectric transformer T201. If the high order N bits of the counter value are greater than the minimum value fmin of the frequency range, or less than the maximum value fmax, the first comparator 305 outputs a "high" logic level, and transmits an up/down stop signal which is a control signal to stop the count up/down operation of the up/down counter 301.

Referring back to FIG. 13, the piezoelectric transformer driving unit 30 of FIG. 13 includes the driving voltage generation unit, which in turn includes an N-bit digital reset counter 307, a second comparator 309, a 1-bit counter 311, and AND gates 313 and 315. For synchronization with the up/down counter 301, the N-bit digital reset counter 307 (hereinafter referred to as the N-bit counter) has a same high-speed clock input from the clock unit 103 as that for the up/down counter 301. Whenever the clock signal is at the "high" logic level, the counter value is increased by 1. Also, if a "low" logic level signal is input to the reset input terminal of the N-bit counter 307, the N-bit counter 307 is reset and the counter value becomes 0. The reset signal input to the N-bit counter 307 is generated by ANDing a system reset signal provided from the reset unit 101, which initializes all logic circuits when power is turned on, and an inverted signal of the output signal (COMPARE OUT) of the second comparator 309 in the AND gate 315. The output of the second comparator 309 is at the "high" logic level when the counter value of the up/down counter, which is the counter value for frequency control, is the same as the counter value of the N-bit counter 307, which is the counter value for driving voltage generation. Accordingly, control of the driving voltage frequency is achieved by the counter value of the up/down counter 301.

The counter value (the high order N bits) of the up/down counter 301, and the counter value of the N-bit counter 307 are input to the second comparator 309, and if the counter value of the N-bit counter 307 is equal to or greater than the counter value of the up/down counter 301, a "high" logic level is output. Also, if a reset signal from the reset unit 101 is input to the second comparator 309, the second comparator 309 is reset. The 1-bit counter 311 is triggered by the output signal of the second comparator 309, and whenever the output of the second comparator 309 is at the "high" logic level, the output voltage is from output terminal is inverted. The output signal of the 1-bit counter 311 is input to the AND gate 313. Also, the 1-bit counter 311 is reset if a reset signal from the reset unit 101 is input.

An inverted version of an ENABLE signal, which is an on/off control signal output from the controller 105, and an output signal output from the 1-bit counter 311 are input to the AND gate 313. According to the result of the operation of the AND gate 313, on/off control of the high-voltage power source output is performed. That is, if the ENABLE signal is at the "low" logic level, the driving voltage is output from the AND gate 313 without being inverted, and a high-voltage power source is output. If the ENABLE signal is at the "high" logic level, the output of the AND gate 313 is forced to be at the "low" logic level, and output of a high-voltage is stopped.

A reset signal from the reset unit 101 and an inverted version of the output signal (COMPARE OUT) of the second comparator 309 are input to the AND gate 315, and a reset signal of the N-bit counter 307 is generated. The output of the AND gate 315 is input to the reset terminal of the N-bit counter 307.

Also, the piezoelectric transformer driving control unit 30 includes a D/A converter 317 which converts the output signal of the controller 105 into an analog signal to generate the output control voltage (Reference_Volt). In this case, the D/A converter 317 is not limited to a specific D/A converter, and a commonly used D/A converter can be used as the D/A converter 317. The output control voltage (Reference_Volt) generated by the conversion process of the D/A converter 317 is input to the operational comparator amplifier 701 disposed in the drive voltage control unit 70 and the comparator 801 disposed in the output voltage detection unit 80. Also, instead of the D/A converter 317, a PWM signal generator may be used.

As described above, in the piezoelectric transformer type high-voltage power source apparatus as shown in FIG. 10, the output control voltage (Reference_Volt), which is a DC voltage, is compared with an output voltage from an output terminal of the driving unit 20. If the output voltage increases, the count value for frequency control (the counter value of the up/down counter) decreases, thereby increasing the frequency of the driving voltage, and at the same time, decreasing the supply power source voltage output (V_DRIVE) in the inductor in the driving unit 20. As a result, the voltage output from the piezoelectric transformer decreases. Meanwhile, if the output voltage decreases, the count value for frequency control (the counter value of the up/down counter) increases and at the same time, the supply power source voltage output (V_DRIVE) in the inductor in the driving unit 20 increases, thereby increasing an output voltage (V_DRIVE) for raising the piezoelectric transformer driving voltage. Since the output control voltage (Reference_Volt) and the output voltage from an output terminal of the piezoelectric transformer reach a target output voltage, the driving voltage frequency and the supply power source voltage output (V_DRIVE) to the inductor are concurrently controlled, and a constant output voltage value from the piezoelectric transformer can be maintained.

Also, in the example embodiment described above, a comparator with a simple circuit structure that is capable of high-speed conversion of the change amount into digital data is used as an output voltage detection unit for converting the analog change of the output voltage to a digital value by comparing the output voltage with the output control voltage. However, the present invention is not limited to this, and, for example, a structure in which an amount change in an analog form is converted into digital data by an A/D converter, thereby sampling the change, may also be used, and the change may be processed by a digital filter or the like, or the change is calculated by a PID controlling technique.

The structure of the piezoelectric transformer type high-voltage power source apparatus 10 of FIG. 10 has been described above. Each element of the high-voltage power source apparatus described above may be formed by using general-purpose modules or circuits, or may also be formed by using hardware customized to the function of each element. Accordingly, the structure can be modified appropriately to the required technology level.

FIGS. 14A-14K are first timing diagrams of a piezoelectric transformer type high-voltage power source apparatus according to an example embodiment of the present invention, and FIGS. 15A-15K is a second timing diagram of a piezoelectric transformer type high-voltage power source apparatus according to an example embodiment of the present invention. An operation of the piezoelectric transformer type high-voltage power source apparatus will now be explained in detail with reference to FIGS. 14A-14K and 15A-15K.

FIGS. 14A-14K explain a control operation timing chart in a period from a high-voltage output ready state to output of a target high-voltage output (off state -> on -> output of target high-voltage). Specifically, FIG. 14A shows a rest signal from a reset unit 101; FIG. 14B shows a clock signal generated from a clock unit 103; FIG. 14C shows an ENABLE signal from the controller 105 to activate the high-voltage power source apparatus; FIG. 14D shows an N-bit counter signal generated from an N-bit counter 307; FIG. 14E shows an up/down counter signal from the up/down counter 301; FIG. 14F shows a COMPARE_OUT signal from the second comparator 309; FIG. 14G shows a FREQ_OUT signal output from the piezoelectric transformer driving control unit 30; FIG. 14H show a Reference_Volt signal and a Feed_Back_Volt signal; FIG. 14I shows an UP/DOWN signal from a comparator 801; FIG. 14J shows a V_DRIVE signal from the drive voltage control unit 70; and FIG. 14K shows a FREQ_DRIVE_OUT output from the piezoelectric transformer.

In the ready state, as illustrated in FIGS. 14A-14K, since the output control voltage (Reference_Volt) is greater than the output voltage (Feedback), the driving frequency (FREQ_OUT) is fmin, and the power source voltage (V_DRIVE) becomes a maximum value. If an ENABLE signal is at a "low" logic level and the apparatus is in an ON state, the output voltage (Feedback) gradually goes up and, an UP signal is input to an up/down counter as an up/down signal. Also, if the output voltage (Feedback) is greater than the output control voltage (Reference_Volt), a DOWN signal is output as the up/down signal, and the up/down counter decreases the counter value. At the same time, the power source voltage (V_DRIVE) is also decreased by the drive voltage control unit 70. In FIG. 14E, 'CntDown' indicates a 'count-down' decreasing of the counter value.

If the counter value of the up/down counter decreases, the upper limit value of the count value of an N-bit counter also decreases. As a result, the driving frequency (FREQ_OUT) of FIG. 14G moves from fmin toward the high frequency side, and is controlled to be ftarget, which is a target driving frequency. In FIG. 14D, 'ft' in the line of the N-bit counter refers to the 'ftarget'. Also, since the power source voltage provided to the piezoelectric transformer is controlled to be gradually decreased, the output voltage (FREQ_DRIVE_OUT) output from the piezoelectric transformer is gradually decreased, and when a target voltage is reached, the output voltage (FREQ_DRIVE_OUT) is controlled to remain at this target voltage.

FIGS. 15A-15K explain a control operation timing chart in a period from when a target high-voltage is output to a period at which a high-voltage output ready state is achieved (a target high-voltage output -> off -> a high-voltage output ready state). Specifically, FIG. 15A shows a rest signal from a reset unit 101; FIG. 15B shows a clock signal generated from a clock unit 103; FIG. 15C shows an ENABLE signal from the controller 105 to activate the high-voltage power source apparatus; FIG. 15D shows an N-bit counter signal generated from an N-bit counter 307; FIG. 15E shows an up/down counter signal from the up/down counter 301; FIG. 15F shows a COMPARE_OUT signal from the second comparator 309; FIG. 15G shows a FREQ_OUT signal output from the piezoelectric transformer driving control unit 30; FIG. 15H show a Reference_Volt signal and a Feed_Back_Volt signal; FIG. 15I shows an UP/DOWN signal from a comparator 801; FIG. 15J shows a V_DRIVE signal from the drive voltage control unit 70; and FIG. 15K shows a FREQ_DRIVE_OUT output from the piezoelectric transformer.

As illustrated in FIGS. 15A-15K, in a state in which a targeted high-voltage is output, the N-bit counter and the up/down counter continue to count until the counter value becomes ftarget ft, and the output voltage (Feedback) becomes similar to the output control voltage (Reference_Volt). Here, if the ENABLE signal is at the "high" logic level and the apparatus is in an OFF state, the value of the output voltage (Feedback) gradually decreases and the voltage value of the output control voltage (Reference_Volt) increases. As a result, the UP signal is output as the up/down signal, and therefore, the up/down counter increase the counter value. At the same time, the power source voltage (V_DRIVE) is also increased by the drive voltage control unit 70. In FIG. 15E, 'CntUp' indicates a 'count-up' increasing of the counter value.

As illustrated in FIG. 15E, if the counter value of the up/down counter increases, the upper limit value of the count value of the N-bit counter also increases accordingly. As a result, the driving frequency (FREQ_OUT) moves from ftarget toward the low frequency side, and is controlled to be fmin, which is a minimum value in the frequency range. Also, the power source voltage applied to the piezoelectric transformer is controlled to be gradually increased until finally reaching a maximum voltage.

Turning more to an image forming apparatus in which a piezoelectric transformer type high-voltage power source apparatus according an example embodiment of the present invention is utilized, such an image forming apparatus is typically provided with a charging unit (not shown) to charge a surface of a latent image supporter (not shown), an exposure unit to form a latent image on the surface of the latent image supporter after a charging thereof, a developing unit to develop the latent image, and a transfer unit to transfer a toner image formed on the latent image supporter to a transfer material.

In this case, the charging unit, the developing unit, and the transfer unit are provided with a predetermined bias (voltage) from a high-voltage power source apparatus, as shown, for example, in FIG. 10. In other words, the image forming apparatus employs the piezoelectric transformer type high-voltage power source apparatus as shown in FIG. 10 as a power source apparatus for providing a voltage to at least one of the charging unit, the developing unit, and the transfer unit.

Since the piezoelectric transformer type high-voltage power source apparatus 10 can stably control the frequency without falling into an abnormal oscillation or uncontrollable state, the charging unit, the developing unit, and the transfer unit of the image forming apparatus using the piezoelectric transformer type high-voltage power source apparatus 10 can stably operate. Also, since a high-voltage can be output within a short rise time, time required for each process of the image forming apparatus can be reduced.

Figure 16:
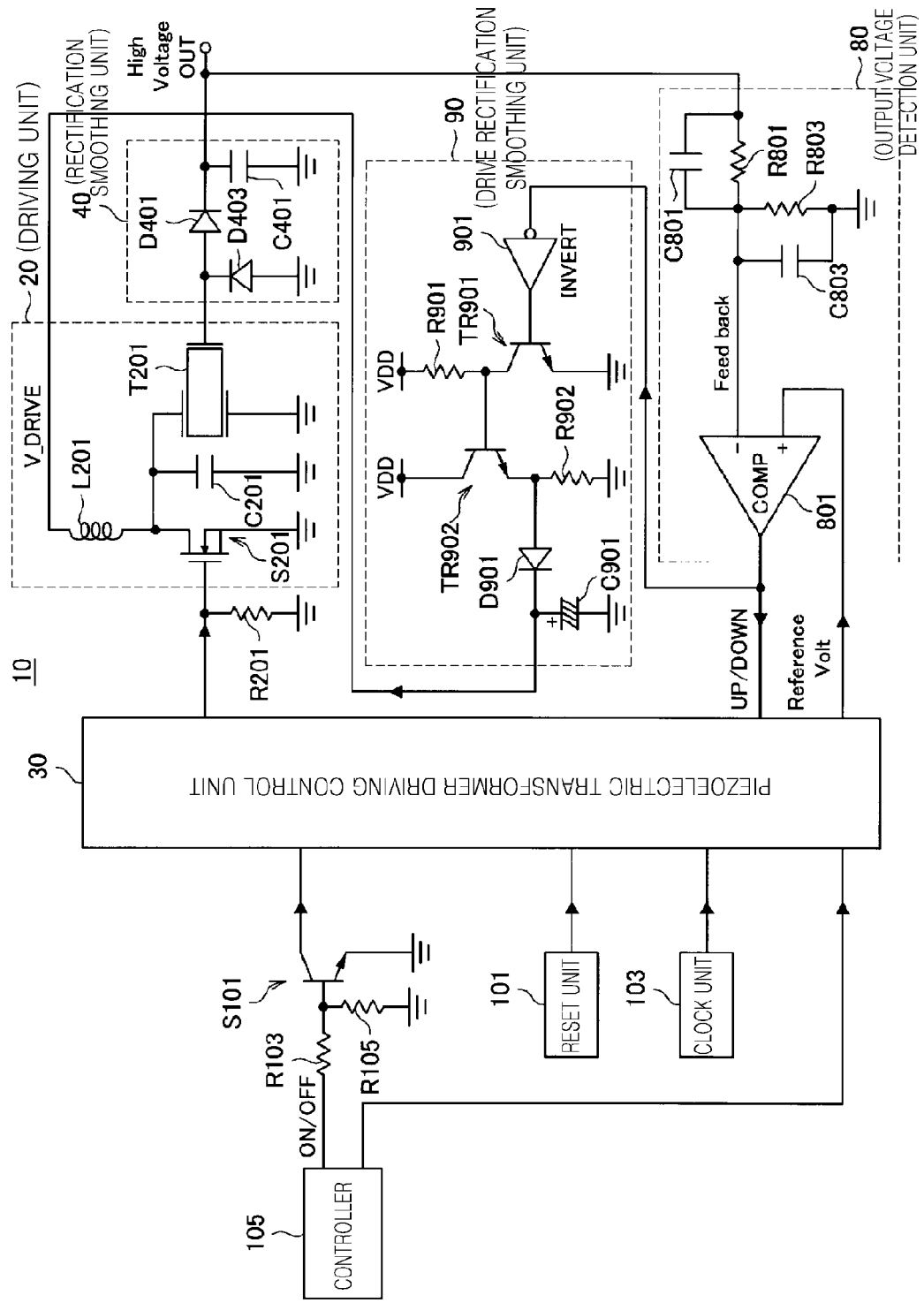
FIG. 16 is a block diagram of a piezoelectric transformer type high-voltage power source apparatus according to another example embodiment of the present invention.

The piezoelectric transformer type high-voltage power source apparatus according to yet another example embodiment will now be explained with reference to FIGS. 16 through 17. FIG. 16 is a block diagram of a piezoelectric transformer type high-voltage power source apparatus 10 according to another example embodiment of the present invention. As shown in FIG. 16, the piezoelectric transformer type high-voltage power source apparatus 10 includes a driving unit 20, a piezoelectric transformer driving control unit 30, a rectification smoothing unit 40, an output voltage detection unit 80, and a drive voltage rectification smoothing output unit 90.

The driving unit 20, the piezoelectric transformer driving control unit 30, and the rectification smoothing unit 40 have the same structures and functions as those of the driving unit 20, the piezoelectric transformer driving control unit 30, and the rectification smoothing unit 40, respectively, of the piezoelectric transformer type high-voltage power source apparatuses 10 and 10. Accordingly, detailed explanations thereof will not be repeated.

The output voltage detection unit 80 includes capacitors C801 and C803, resistors R801 and R803, and a comparator (COMP) 801. The output voltage, which is rectified and smoothed to a DC voltage by the rectification smoothing unit 40, is divided by the voltage divider resistors R801 and R803 in the output voltage detection unit 80 and is input to an inverted input terminal (− terminal) of the comparator 801 as an error detection voltage (Feedback). Also, the capacitors C801 and C803 connected in parallel to the voltage divider resistors R801 and R803, respectively, adjust the AC and DC components of the output voltage. Also, an output control voltage, which is a DC voltage controlling an output voltage, is input as a reference voltage (Reference_Volt) to the non-inverted input terminal (+ terminal) of the comparator 801.

The comparator 801 compares magnitudes of the output control voltage (Reference_Volt) and the output voltage (Feedback), and outputs a comparison result. If the output of the comparator indicates the output voltage (Feedback) is greater than the output control voltage (Reference_Volt), the output of the comparator 801 is at a "low" logic level, and if the output voltage (Feeback) is less than the output control voltage (Reference_Volt), the output of the comparator 501 is at a "high" logic level. Due to the comparator 801, an analog change in the output voltage can be represented by a digital value. The digital value output from the comparator 801 is a control signal (UP/DOWN) to control the frequency control unit in the piezoelectric transformer driving control unit 30, and is input to the piezoelectric transformer driving control unit 30. Also, the UP/DOWN signal output from the comparator 801 is input to the drive voltage rectification smoothing output unit 90, which will be explained later.

The drive voltage rectification smoothing output unit 90 controls a drive voltage (V_DRIVE) supplied to the piezoelectric transformer T201 by using the UP/DOWN signal output from the output voltage detection unit 80. The drive voltage rectification smoothing output unit 90 includes an inverter (INVERT) 901, transistors TR901 and TR902, resistors R901 and R902, a capacitor C901, and a diode D901. The UP/DOWN signal output from the output voltage detection unit 80 is polarity-inverted by the inverter 901, and is input to the base of the transistor TR901, which is a $V_{DD}$ voltage conversion transistor. The UP/DOWN signal input to the base of the transistor (TR901 is again polarity-inverted and converted to a $V_{DD}$ level.

The UP/DOWN signal converted to the $V_{DD}$ level is input to the base of the transistor (TR902, which is a buffer transistor. The output signal from the transistor (TR902 is rectified and smoothed through the diode (D901 and the capacitor (C901, and output as the drive voltage (a supply power source voltage) (V_DRIVE).

FIGS. 17A-17C represents a diagram illustrating a relationship between an UP/DOWN signal and a V_DRIVE signal in the piezoelectric transformer type high-voltage power source apparatus 10 according to an example embodiment of the present invention. Referring to FIGS. 17A-17C, if the UP/DOWN signal output is at a "high" logic level, the V_DRIVE, which is output from the drive voltage rectification smoothing output unit 90, corresponds to a $V_{DD}$ (specifically, $V_{DD}$—the voltage of the buffer transistor TR902—the voltage of the diode D901), and if the UP/DOWN signal output is at a "low" logic level, the V_DRIVE becomes 0V. Also, if the "high" logic level output time is the same as the "low" logic level output time, V_DRIVE becomes $V_{DD}/2$.

Turning to an image forming apparatus in which a piezoelectric transformer type high-voltage power source apparatus according to an example embodiment of the present invention is utilized, such an image forming apparatus is typically provided with a charging unit to charge a surface of a latent image supporter, an exposure unit to form a latent image on the surface of the latent image supporter after the charging thereof, a developing unit to develop the latent image, and a transfer unit to transfer a toner image formed on the latent image supporter to a transfer material.

In this case, the charging unit, the developing unit, and the transfer unit are provided with a predetermined bias (voltage) from a high-voltage power source apparatus as shown, for example, in FIG. 16. In other words, the image forming apparatus employs the piezoelectric transformer type high-voltage power source apparatus shown in FIG. 16 as a power source apparatus to provide a voltage to at least one of the charging unit, the developing unit, and the transfer unit.

Since the piezoelectric transformer type high-voltage power source apparatus 10 according to example embodiments of the present invention can stably control the frequency without falling into an abnormal oscillation or uncontrollable state, the charging unit, the developing unit, and the transfer unit of the image forming apparatus using the piezoelectric transformer type high-voltage power source apparatus 10 can stably operate. Also, since a high-voltage can be output within a short rise time, time required for each process of the image forming apparatus can be reduced.

As described above, in the piezoelectric transformer type high-voltage power source apparatus, the driving voltage generation unit of the piezoelectric transformer is formed by the N-bit counter, which is a reset counter, and the frequency control unit is formed by an up/down counter functioning as a digital processing circuit. Also, the changing control range of the frequency changing control up/down counter can be set by a minimum frequency range setting register fmin and a maximum frequency range setting register fmax. In this way, the frequency range is set, and the frequency can be controlled stably without the driving voltage falling into an abnormal oscillation or uncontrollable state.

As described above, in the piezoelectric transformer type high-voltage power source apparatus according to each example embodiment and the subsequent modified embodiments of the present invention, the driving voltage generation unit of the piezoelectric transformer is formed by the N-bit counter, which is a reset counter, and the frequency control unit is formed by an up/down counter functioning as a digital processing circuit. Also, the changing control range of the frequency changing control up/down counter can be set by a minimum frequency range setting register fmin and a maximum frequency range setting register fmax. In this way, the frequency range is set, and the frequency can be controlled stably without the driving voltage falling into an abnormal oscillation or uncontrollable state.

Also, in the piezoelectric transformer type high-voltage power source apparatus according to each example embodiment and the subsequent modified embodiments of the present invention, when the output is made to be in an OFF state by an external ON/OFF control signal, the piezoelectric transformer driving control unit controls the frequency to become a minimum frequency fmin, which may vary, at which point a high-voltage output value becomes a maximum value. Accordingly, when the output is in an ON state, output of a high-voltage within a short rise is enabled.

Furthermore, in the piezoelectric transformer type high-voltage power source apparatus according example embodiments of the present invention, changes in a high-voltage output voltage that is output from the apparatus is detected together with the frequency changing control, and the supply power source voltage supplied to the driving unit is variably controlled. In this way, the driving frequency can be shifted from the maximum of the frequency range fmax with low efficiency to the minimum of the frequency range fmin with high efficiency. As a result, the output voltage efficiency is improved.

Accordingly, in the piezoelectric transformer type high-voltage power source apparatus according example embodiments of the present invention, stable frequency control and the ability to output a high-voltage output voltage within a short rise time are enabled. Also, an efficient piezoelectric transformer type high-voltage power source apparatus and image forming apparatus capable of stably controlling an output with a maximum output voltage equal to or less than hundreds of volts to kilovolts can be provided.

Furthermore, by forming the piezoelectric transformer driving control unit with a logic circuit, it can be mounted on a typical application-specific integrated circuit (ASIC), and cost of the frequency control unit can be lowered.

As a result, according to example embodiments of the present invention, a piezoelectric transformer type high-voltage power source apparatus, stable frequency control can be performed without the driving voltage falling into an abnormal oscillation or uncontrollable state, a high-voltage output voltage can be output within a short rise time, and an image forming apparatus using the high-voltage power source apparatus can be provided.

While there have been illustrated and described what are considered to be example embodiments of the present invention, it will be understood by those skilled in the art and as technology develops that various changes and modifications, may be made, and equivalents may be substituted for elements thereof without departing from the true scope of the present invention. Many modifications, permutations, additions and sub-combinations may be made to adapt the teachings of the present invention to a particular situation without departing from the scope thereof. For example, although control of a constant voltage by detecting a change in an output voltage and making the voltage value constant is explained in the example embodiments described above, control of a constant current may be performed instead of the constant voltage control, in which a change in an output current is detected and the current value is made to be constant. Even when this constant current control is performed, the operation will be the same as that of the constant voltage control. Accordingly, it is intended, therefore, that the present invention not be limited to the various example embodiments disclosed, but that the present invention includes all embodiments falling within the scope of the appended claims.

What is claimed is:

1. A power source apparatus in which a driving voltage determined by a value of a driving frequency is applied to a piezoelectric transformer to output an output voltage, the apparatus comprising:
   an output voltage detection unit to compare the output voltage with a reference voltage for controlling the output voltage, and based on a comparison result thereof, detect a change of the output voltage and represent the change with a digital value; and
   a driving control unit to perform driving control of the piezoelectric transformer according to the digital value of the detected change by using the driving voltage to maintain the output voltage at a predetermined value.

2. The apparatus of claim 1, wherein the driving control unit comprises:
   a driving frequency control unit to vary and control the driving frequency of the piezoelectric transformer according to the digital value of the detected change; and
   a driving voltage generation unit to generate the driving voltage to drive the piezoelectric transformer according to the driving frequency that is output by the driving frequency control unit.

3. The apparatus of claim 2, wherein, if the output voltage is greater than the reference voltage, the digital value causes the driving frequency control unit to increases the driving frequency, and if the output voltage is less than the reference voltage, the digital value cause the driving frequency control unit to decrease the driving frequency.

4. The apparatus of claim 2, wherein the driving control unit further comprises:
   a memory unit to store predetermined frequency range values of the driving frequency; and
   a frequency range control unit to control the driving frequency to be changed to a value in a predetermined frequency range based on the predetermined frequency range values stored in the memory unit and the driving frequency that is output by the driving frequency control unit.

5. The apparatus of claim 4, wherein, if the driving frequency that is output by the driving frequency control unit exceeds the predetermined frequency range values, the frequency range control unit outputs a control signal to stop an increase or a decrease of the driving frequency, and the driving frequency control unit stops the increase or the decrease of the driving frequency according to the control signal input from the frequency range control unit.

6. A power source apparatus in which a driving voltage determined by a value of a driving frequency is applied to a piezoelectric transformer to output an output voltage output, the apparatus comprising:
   a driving control unit to calculate a change in the output voltage based on the output voltage and a reference voltage for controlling the output voltage, in order to maintain the output voltage at a predetermined value, and to control the driving frequency of the piezoelectric transformer by digital signal processing based on the calculated change.

7. The apparatus of claim 6, wherein the driving control unit comprises:
   an A/D converter to convert the output voltage to digital data;
   a digital value calculation unit to calculate a digital value of the output voltage based on the output voltage converted to the digital data and the reference voltage;

a driving frequency control unit to vary and control the driving frequency of the piezoelectric transformer according to the calculated digital value; and a driving voltage generation unit to generate the driving voltage to drive the piezoelectric transformer according to an output value of the driving frequency control unit.

8. The apparatus of claim 7, wherein, if the output voltage is greater than the reference voltage, the digital value causes the driving frequency control unit to increase the driving frequency, and if the output voltage is less than the reference voltage, the digital value causes the driving frequency control unit to decrease the driving frequency.

9. The apparatus of claim 7, wherein the driving control unit further comprises:
 a memory unit to store predetermined frequency range values of the driving frequency; and
 a frequency range control unit to control the driving frequency to be changed to values within a predetermined frequency range based on the predetermined frequency range values stored in the memory unit and the driving frequency that is output by the driving frequency control unit.

10. The apparatus of claim 9, wherein if the driving frequency that is output by the driving frequency control unit exceeds the predetermined frequency range values, the frequency range control unit outputs a control signal to stop an increase or a decrease of the driving frequency, and the driving frequency control unit stops the increase or the decrease of the driving frequency according to the control signal input from the frequency range control unit.

11. The apparatus of claim 7, wherein the digital value calculation unit calculates the digital value by using a calculation performed by a digital filter or by a proportional-integral-derivative (PID) controlling technique.

12. A power source apparatus in which a driving voltage determined by a value of a driving frequency is applied to a piezoelectric transformer to output an output voltage, the apparatus comprising:
 an output voltage detection unit to compare the output voltage with a reference voltage for controlling the output voltage, and based on a comparison result thereof, detect a change of the output voltage and indicate the change with a digital value;
 a driving control unit to perform driving control of the piezoelectric transformer according to the digital value of the detected change in order to maintain the output voltage at a predetermined value; and
 a drive voltage control unit to vary and control a power source voltage applied to the piezoelectric transformer according to the comparison result of the output voltage with the reference voltage.

13. The apparatus of claim 12, wherein if the output voltage is less than the reference voltage, the drive voltage control unit increases the power source voltage, and if the output voltage is greater than the reference voltage, the drive voltage control unit decreases the power source voltage.

14. The apparatus of claim 13, wherein the driving control unit comprises:
 a driving frequency control unit to vary and control the driving frequency of the piezoelectric transformer according to the digital value of the detected change; and
 a driving voltage generation unit to generate the driving voltage to drive the piezoelectric transformer according to the driving frequency that is output by the driving frequency control unit.

15. The apparatus of claim 14, wherein, if the output voltage is greater than the reference voltage, the digital value cause the driving frequency control unit to increase the driving frequency, and if the output voltage is less than the reference voltage, the digital value cause the driving frequency control unit to decrease the driving frequency.

16. The apparatus of claim 14, wherein the driving control unit further comprises:
 a memory unit to store predetermined frequency range values of the driving frequency; and
 a frequency range control unit to control the driving frequency to be changed to a value in a predetermined frequency range based on the predetermined frequency range values stored in the memory unit and the driving frequency that is output by the driving frequency control unit.

17. The apparatus of claim 16, wherein if the driving frequency that is output by the driving frequency control unit exceeds the predetermined frequency range values, the frequency range control unit outputs a control signal to stop an increase or a decrease of the driving frequency, and the driving frequency control unit stops the increase or the decrease of the driving frequency according to the control signal input from the frequency range control unit.

18. An image forming apparatus comprising:
 the piezoelectric transformer high-voltage power source apparatus of claim 1;
 a charging unit to charge a surface of a latent image supporter;
 an exposure unit to form a latent image on the surface of the latent image supporter after the charging thereof;
 a developing unit to develop the latent image; and
 a transfer unit to transfer a toner image formed on the latent image supporter to a transfer material;
 wherein the power source apparatus provides a voltage to at least one of the charging unit, the exposure unit, the developing unit, and the transfer unit.

* * * * *